US011676966B2

(12) United States Patent
Dewey et al.

(10) Patent No.: US 11,676,966 B2
(45) Date of Patent: Jun. 13, 2023

(54) STACKED TRANSISTORS HAVING DEVICE STRATA WITH DIFFERENT CHANNEL WIDTHS

(71) Applicant: INTEL CORPORATION, Santa Clara, CA (US)

(72) Inventors: Gilbert W. Dewey, Beaverton, OR (US); Jack T. Kavalieros, Portland, OR (US); Willy Rachmady, Beaverton, OR (US); Cheng-Ying Huang, Portland, OR (US); Matthew V. Metz, Portland, OR (US); Kimin Jun, Portland, OR (US); Patrick Morrow, Portland, OR (US); Aaron D. Lilak, Beaverton, OR (US); Ehren Mannebach, Tigard, OR (US); Anh Phan, Beaverton, OR (US)

(73) Assignee: Intel Corporation, Santa Clara, CA (US)

( * ) Notice: Subject to any disclaimer, the term of this patent is extended or adjusted under 35 U.S.C. 154(b) by 916 days.

(21) Appl. No.: 16/354,960

(22) Filed: Mar. 15, 2019

(65) Prior Publication Data

US 2020/0295003 A1    Sep. 17, 2020

(51) Int. Cl.
*H01L 27/092*    (2006.01)
*H01L 29/16*    (2006.01)
(Continued)

(52) U.S. Cl.
CPC .. *H01L 27/0924* (2013.01); *H01L 21/823807* (2013.01); *H01L 21/823821* (2013.01);
(Continued)

(58) Field of Classification Search
CPC ........ H01L 27/0924; H01L 21/823807; H01L 21/823821; H01L 23/3128; H01L 23/5383;
(Continued)

(56) References Cited

U.S. PATENT DOCUMENTS 9,812,574 B2    11/2017    Pillarisetty et al.
2003/0110452 A1*    6/2003    Leahy ................... H05K 3/303
716/120
(Continued)

FOREIGN PATENT DOCUMENTS

EP    3588546 A1    1/2020
WO    2019135766 A1    7/2019

OTHER PUBLICATIONS

U.S. Appl. No. 16/024,058, filed Jun. 29, 2018, entitled "Interconnect Techniques for Electrically Connecting Source/Drain Regions of Stacked Transistors," Inventor(s): Aaron D. Lilak, et al.
(Continued)

*Primary Examiner* — Tong-Ho Kim
(74) *Attorney, Agent, or Firm* — Akona IP

(57) ABSTRACT

Disclosed herein are stacked transistors having device strata with different channel widths, as well as related methods and devices. In some embodiments, an integrated circuit structure may include stacked strata of transistors, wherein different channel materials of different strata have different widths.

19 Claims, 23 Drawing Sheets

(51) Int. Cl.

| | |
|---|---|
| *H01L 29/20* | (2006.01) |
| *H01L 29/06* | (2006.01) |
| *H01L 29/78* | (2006.01) |
| *H01L 21/8238* | (2006.01) |
| *H01L 25/065* | (2023.01) |
| *H01L 23/00* | (2006.01) |
| *H01L 23/31* | (2006.01) |
| *H01L 23/538* | (2006.01) |
| *H01L 29/10* | (2006.01) |

(52) U.S. Cl.
CPC ...... *H01L 23/3128* (2013.01); *H01L 23/5383* (2013.01); *H01L 24/17* (2013.01); *H01L 25/065* (2013.01); *H01L 29/0673* (2013.01); *H01L 29/1033* (2013.01); *H01L 29/16* (2013.01); *H01L 29/20* (2013.01); *H01L 29/7851* (2013.01); *H01L 2224/0401* (2013.01)

(58) Field of Classification Search
CPC ... H01L 24/17; H01L 25/065; H01L 29/0673; H01L 29/1033; H01L 29/16; H01L 29/20; H01L 29/7851; H01L 2224/0401; H01L 21/8221; H01L 21/823431; H01L 27/0688; H01L 27/0886; H01L 27/092; H01L 29/401; H01L 29/42392; H01L 29/66439; H01L 29/775; H01L 29/7854; H01L 29/78681; H01L 29/78696; B82Y 10/00

USPC ........................................................ 257/369
See application file for complete search history.

(56) References Cited

U.S. PATENT DOCUMENTS

| | | | |
|---|---|---|---|
| 2016/0064545 A1* | 3/2016 | Pillarisetty | ........ H01L 29/66795 257/365 |
| 2018/0374753 A1 | 12/2018 | Pawlak et al. | |
| 2019/0172755 A1* | 6/2019 | Smith | ............. H01L 21/823864 |
| 2019/0326286 A1* | 10/2019 | Xie | ................... H01L 29/66545 |
| 2019/0393214 A1 | 12/2019 | Lilak et al. | |
| 2020/0006331 A1* | 1/2020 | Lilak | ............... H01L 21/823431 |
| 2020/0098756 A1* | 3/2020 | Lilak | ............... H01L 21/823842 |

OTHER PUBLICATIONS

U.S. Appl. No. 16/024,080, filed Jun. 28, 2018, entitled "Techniques for Forming Gate Structures for Transistors Arranged in a Stacked Configuration on a Single Fin Structure," Inventor(s): Aaron D. Lilak, et al.

U.S. Appl. No. 16/240,369, filed Jan. 4, 2019, entitled "Gate-All-Around Integrated Circuit Structures Having Depopulated Channel Structures Using Bottom-Up Oxidation Approach," Inventor(s): Willy Rachmady, et al.

EPO Jun. 17, 2020 Extended European Search Report and Opinion from European Application No. 20152791.8; 10 pages.

* cited by examiner

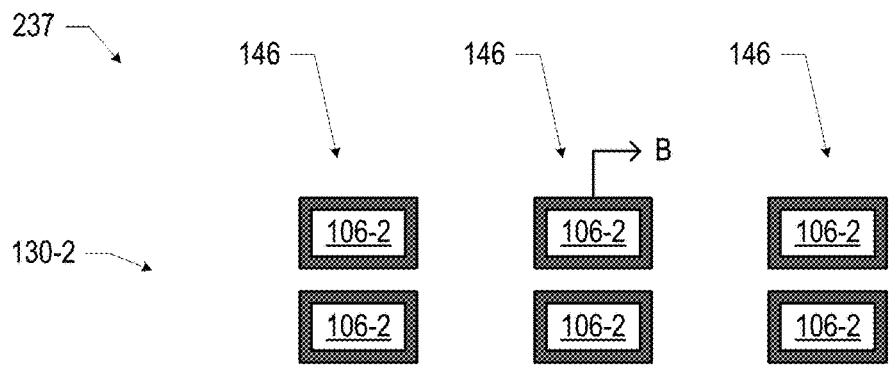
FIG. 11A
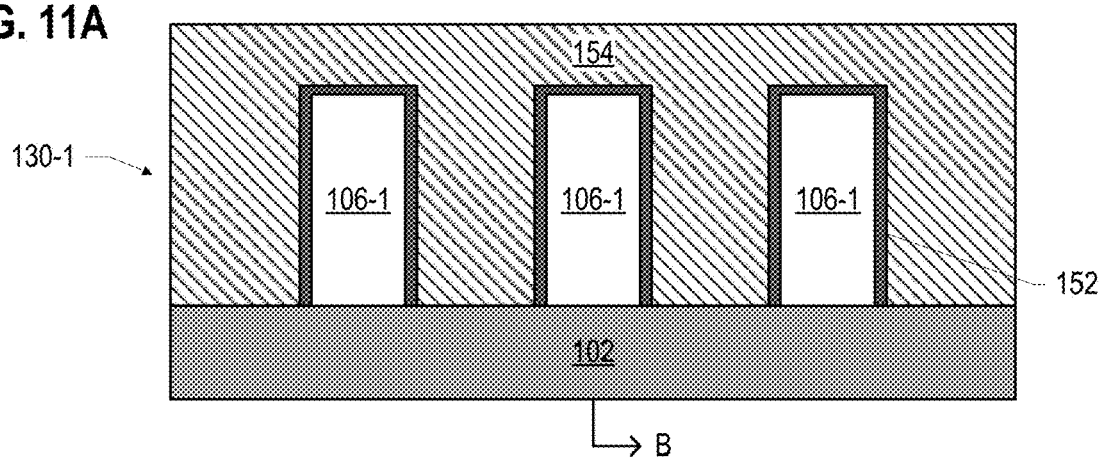
FIG. 11B
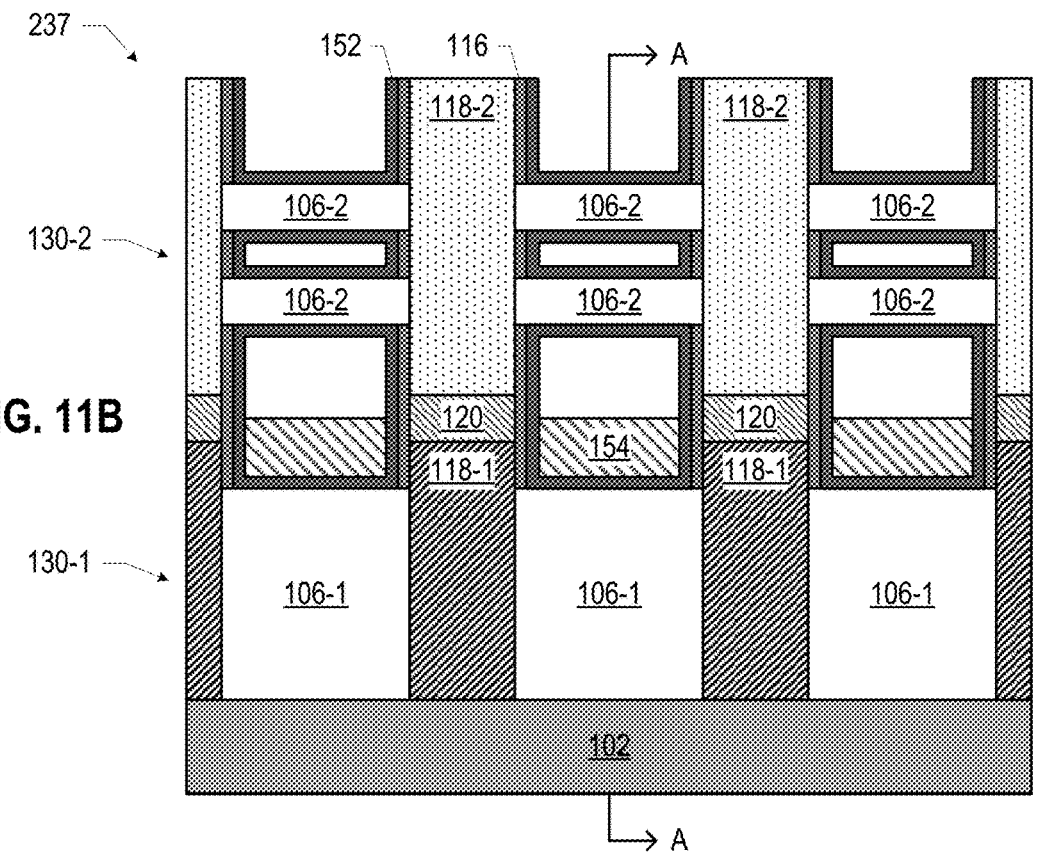

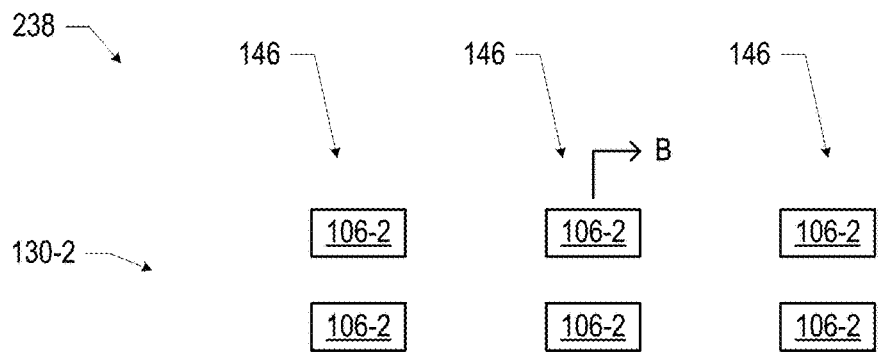
FIG. 12A
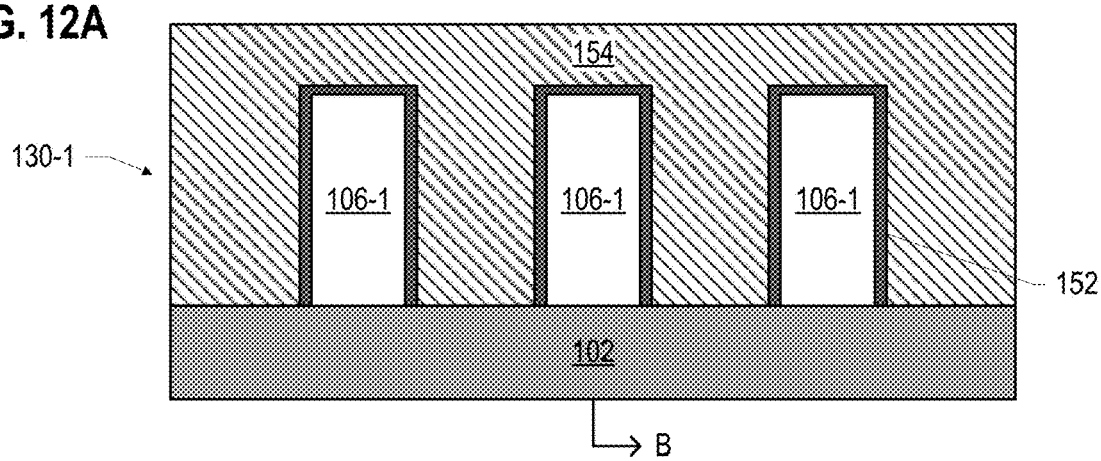
FIG. 12B
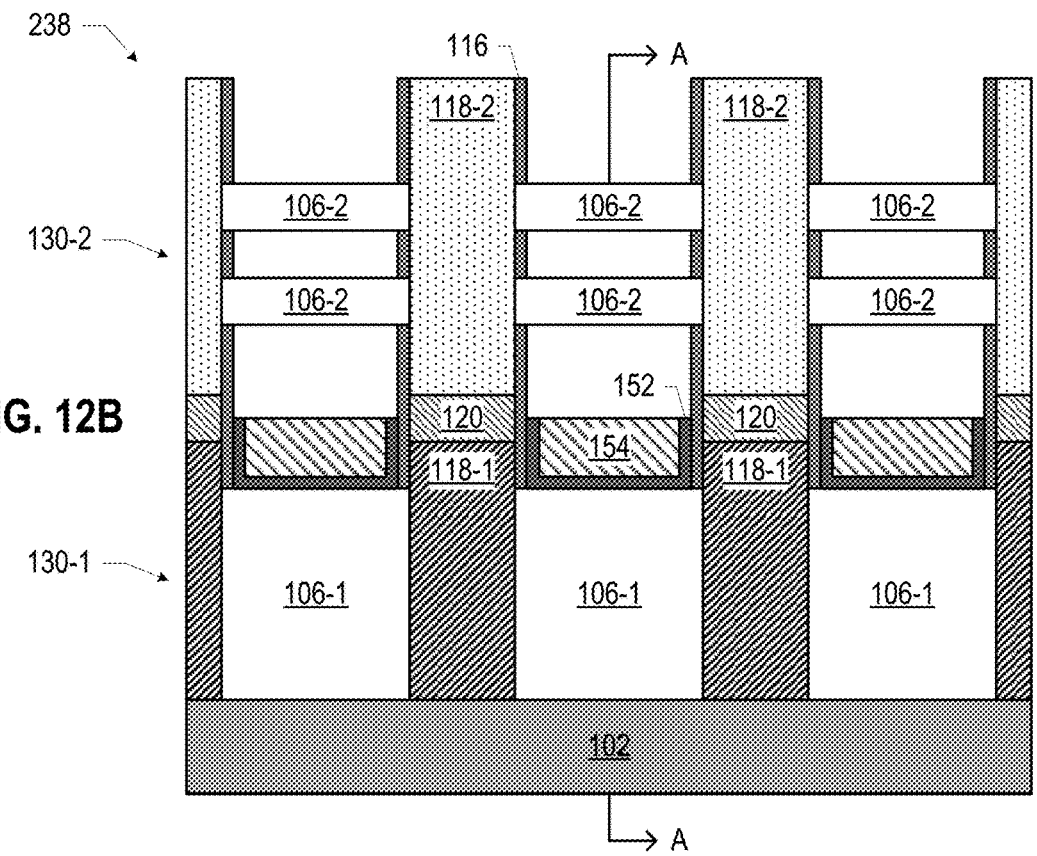

STACKED TRANSISTORS HAVING DEVICE STRATA WITH DIFFERENT CHANNEL WIDTHS

BACKGROUND

Conventional integrated circuit devices include a device layer in which transistors are arranged in a single layer. Above this device layer are interconnect layers that provide electrical connections between various ones of the transistors in the device layer.

BRIEF DESCRIPTION OF THE DRAWINGS

Embodiments will be readily understood by the following detailed description in conjunction with the accompanying drawings. To facilitate this description, like reference numerals designate like structural elements. Embodiments are illustrated by way of example, not by way of limitation, in the figures of the accompanying drawings.

FIGS. 2A-2B, 3A-3B, 4A-4B, 5A-5B, 6A-6B, 7A-7B, 8A-8B, 9A-9B, 10A-10B, 11A-11B, 12A-12B, 13A-13B, 14A-14B, 15A-15B, and 16A-16B are cross-sectional views of stages in an example process of manufacturing the IC structure of FIG. 1, in accordance with various embodiments.

FIGS. 12A-12B, 17A-17B, 18A-18B, 19A-19B, 20A-20B, and 21 are cross-sectional views of example IC structures, in accordance with various embodiments.

DETAILED DESCRIPTION

Disclosed herein are stacked transistors having device strata with different channel widths, as well as related methods and devices. In some embodiments, an integrated circuit structure may include stacked strata of transistors, wherein different channel materials of different strata have different widths.

In the following detailed description, reference is made to the accompanying drawings that form a part hereof wherein like numerals designate like parts throughout, and in which is shown, by way of illustration, embodiments that may be practiced. It is to be understood that other embodiments may be utilized, and structural or logical changes may be made, without departing from the scope of the present disclosure. Therefore, the following detailed description is not to be taken in a limiting sense.

Various operations may be described as multiple discrete actions or operations in turn, in a manner that is most helpful in understanding the claimed subject matter. However, the order of description should not be construed as to imply that these operations are necessarily order dependent. In particular, these operations may not be performed in the order of presentation. Operations described may be performed in a different order from the described embodiment. Various additional operations may be performed, and/or described operations may be omitted in additional embodiments.

For the purposes of the present disclosure, the phrase "A and/or B" means (A), (B), or (A and B). For the purposes of the present disclosure, the phrase "A, B, and/or C" means (A), (B), (C), (A and B), (A and C), (B and C), or (A, B, and C). The drawings are not necessarily to scale. Although many of the drawings illustrate rectilinear structures with flat walls and right-angle corners, this is simply for ease of illustration, and actual devices made using these techniques will exhibit rounded corners, surface roughness, and other features.

The description uses the phrases "in an embodiment" or "in embodiments," which may each refer to one or more of the same or different embodiments. Furthermore, the terms "comprising," "including," "having," and the like, as used with respect to embodiments of the present disclosure, are synonymous. As used herein, a "package" and an "integrated circuit (IC) package" are synonymous. When used to describe a range of dimensions, the phrase "between X and Y" represents a range that includes X and Y. For convenience, the phrase "FIG. 1" may be used to refer to the collection of drawings of FIGS. 1A-1B, the phrase "FIG. 2" may be used to refer to the collection of drawings of FIGS. 2A-2B, etc.

Figure 1A:
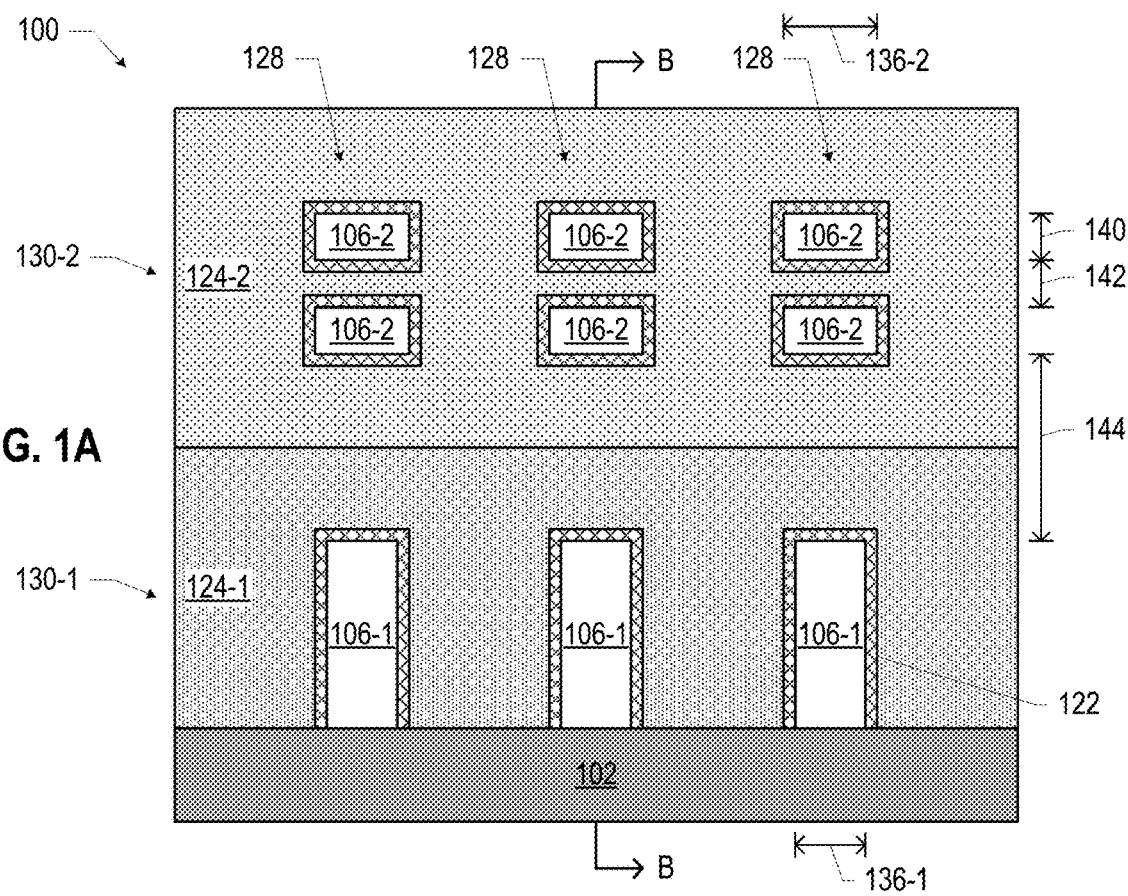
FIGS. 1A-1B are cross-sectional views of an integrated circuit (IC) structure, in accordance with various embodiments.
Figure 1B:
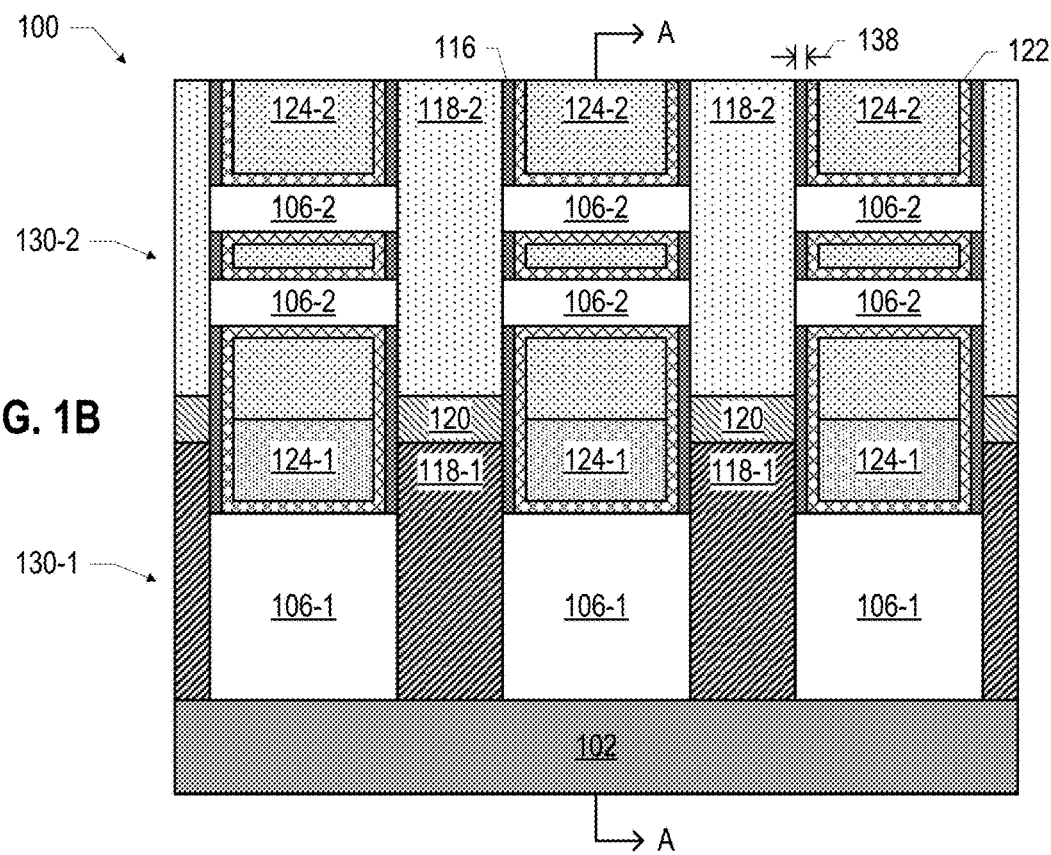
Figure 2A:
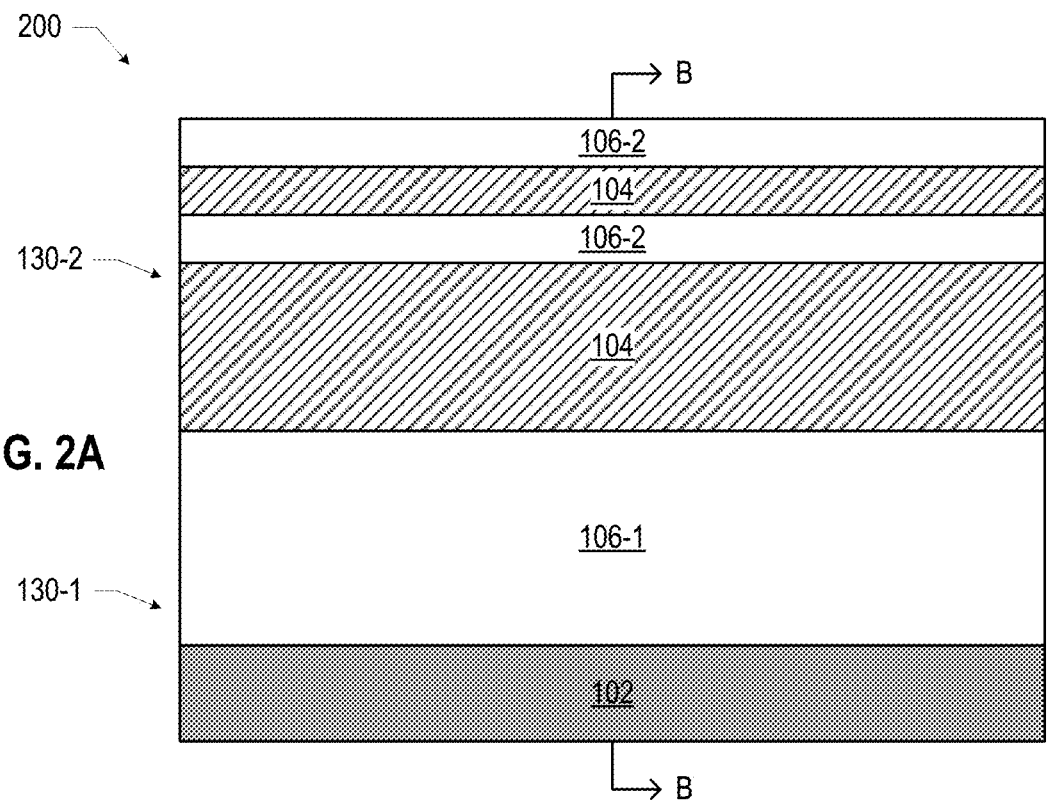
Figure 2B:
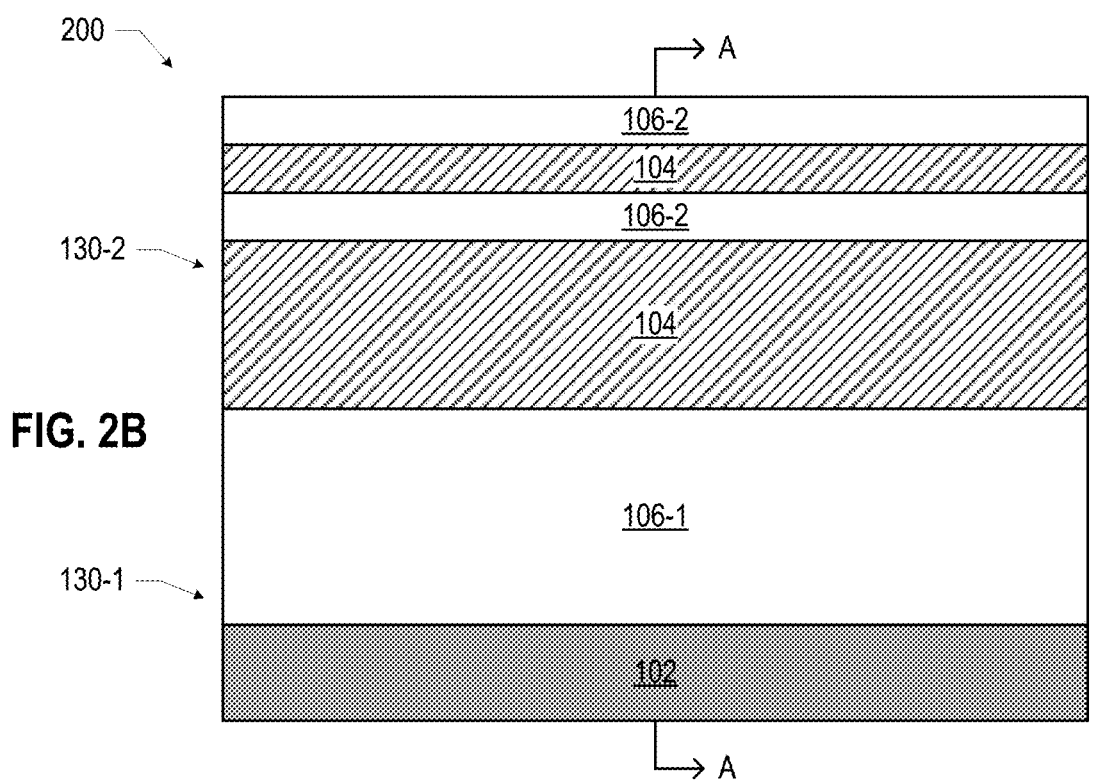

FIG. 1 illustrates an IC structure 100; FIG. 1A is a cross-sectional view through the section A-A of FIG. 1B, and FIG. 1B is a cross-sectional view through the section B-B of FIG. 1A. In particular, FIG. 1A is a cross-sectional view taken across multiple device stacks 128, and FIG. 1B is a cross-sectional view taken along a single device stack 128. All of the "A" and "B" sub-figures in the accompanying drawings share the perspective of the cross-sectional views of FIGS. 1A and 1B, respectively.

The IC structure 100 includes one or more device stacks 128, with each device stack 128 including two or more device strata 130. Although various ones of the accompanying drawings depict a particular number of device stacks 128 (e.g., three) and a particular number of device strata 130 (e.g., two), this is simply for ease of illustration, and an IC structure 100 may include more or fewer transistors stacks 128 and/or more device strata 130.

The device strata 130 in a device stack 128 may be oriented vertically relative to an underlying base 102; that is, different ones of the device strata 130 in a device stack 128 may be arrayed perpendicularly to the surface of the base 102. In FIG. 1 (and others of the accompanying drawings), the device stratum 130-1 is between the device stratum 130-2 and the base 102. Corresponding ones of the device strata 130 of different ones of the device stacks 128 may be aligned; for example, the device stratum 130-1 of one device stack 128 may have features aligned with corresponding features of the device stratum 130-1 of a different device stack 128. For ease of illustration, the device strata 130 will largely be discussed herein without reference to a particular device stack 128 of which they are a part. However, some or all of the device strata 130 in one device stack 128 may be different from the corresponding device strata 130 in another device stack 128 (e.g., by selective masking and separate processing of the different device stacks 128).

The base 102 may be a semiconductor substrate composed of semiconductor material systems including, for example, n-type or p-type materials systems (or a combination of both). The base 102 may include, for example, a crystalline substrate formed using a bulk silicon or a silicon-on-insulator (SOI) substructure. The base 102 may include a layer of silicon dioxide on a bulk silicon or gallium arsenide substrate. The base 102 may include a converted layer (e.g., a silicon layer that has been converted to silicon dioxide during an oxygen-based annealing process). In some embodiments, the base 102 may be formed using alternative materials, which may or may not be combined with silicon, that include but are not limited to germanium, indium antimonide, lead telluride, indium arsenide, indium phosphide, gallium arsenide, or gallium antimonide. Further materials classified as group II-VI, III-V, or IV may also be used to form the base 102. Although a few examples of materials from which the base 102 may be formed are described here, any material or structure that may serve as a foundation for an IC structure 100 may be used. The base 102 may be part of a singulated die (e.g., the dies 1502 of FIG. 22) or a wafer (e.g., the wafer 1500 of FIG. 22). In some embodiments, the base 102 may itself include an interconnect layer, an insulation layer, a passivation layer, an etch stop layer, additional device layers, etc.

Each device stratum 130 may include channel material 106 having a longitudinal axis (into the page from the perspective of FIG. 1A and left-right from the perspective of FIG. 1B). The channel material 106 of a device stratum may be arranged in any of a number of ways. For example, FIG. 1 illustrates the channel material 106-1 of the device stratum 130-1 as including a semiconductor fin, while the channel material 106-2 of the device stratum 130-2 includes multiple semiconductor wires (e.g., nanowires or nanoribbons). Although various ones of the accompanying drawings depict a particular number of wires in the channel material 106 of a device stratum 130, this is simply for ease of illustration, and a device stratum 130 may include more or fewer wires as the channel material 106. In other embodiments, the channel material 106 of one or more of the device strata 130 may include a semiconductor fin instead of or in addition to one or more semiconductor wires; examples of such embodiments are discussed below with reference to FIGS. 19 and 20. In some embodiments, the channel material 106 may include silicon and/or germanium. In some embodiments, the channel material 106 may include indium antimonide, lead telluride, indium arsenide, indium phosphide, gallium arsenide, or gallium antimonide, or further materials classified as group II-VI, III-V, or IV. In some embodiments, the channel material 106 may include a semiconducting oxide (e.g., indium gallium zinc oxide). In some embodiments, the material composition of the channel material 106 used in different ones of the device strata 130 may be different, or may be the same. For example, in some embodiments, the channel material 106 in the device stratum 130-1 (130-2) may include silicon while the channel material 106 used in the device stratum 130-2 (130-1) may include germanium. In another example, in some embodiments, the channel material 106 in the device stratum 130-1 (130-2) may include silicon or germanium while the channel material 106 used in the device stratum 130-2 (130-1) may include a III-V material.

Figure 17A:
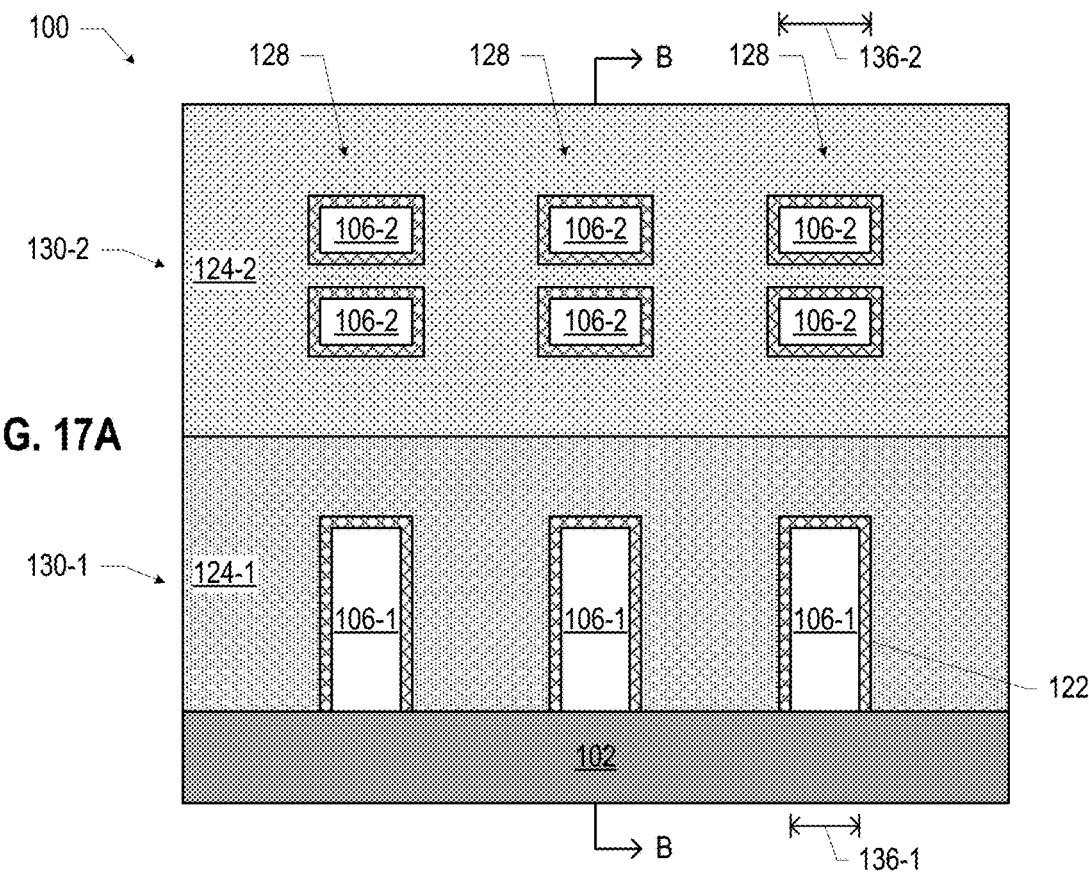
Figure 17B:
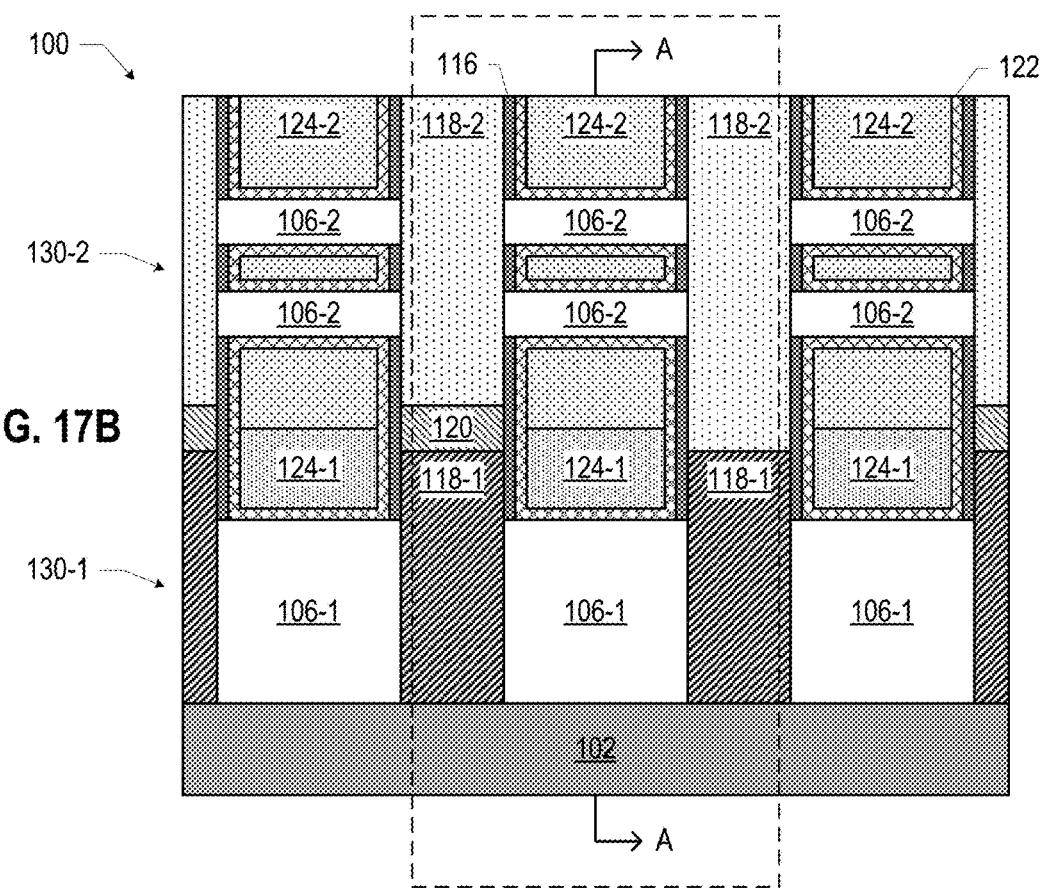

Source/drain (S/D) material 118 may be in electrical contact with the longitudinal ends of the channel material 106, allowing current to flow from one portion of S/D material 118 to another portion of S/D material 118 through the channel material 106 (upon application of appropriate electrical potentials to the S/D material 118 through S/D contacts, not shown) during operation. In some embodiments, the material composition of the S/D material 118 used in different ones of the device strata 130 may be different; for example, FIG. 1 illustrates an S/D material 118-1 in the device stratum 130-1 and an S/D material 118-2 in the device stratum 130-2. In other embodiments, the material composition of the S/D material 118 used in different ones of the device strata 130 may be the same. In a single device stack 128, the S/D material 118 of different device strata 130 may be electrically isolated, or may be in electrical contact. For example, FIG. 1B illustrates an insulating material 120 disposed between the S/D material 118-1 and the S/D material 118-2 to electrically isolate the S/D material 118-1 from the S/D material 118-2. The insulating material 120 may include any suitable insulator, such as silicon dioxide, silicon nitride, silicon carbide, silicon oxynitride, a polymer, or any suitable combination of these materials. In other embodiments, the insulating material 120 may not be present, and the S/D material 118-1 may be in contact (physical and electrical) with the S/D material 118-2. Different portions of the S/D material 118 in different device strata 130 may be isolated/coupled to achieve a desired circuit; an example of an IC structure 100 including selective coupling of S/D material 118 in different device strata 130 is illustrated in FIG. 17 and discussed below.

In some embodiments, the S/D materials 118 may include a silicon alloy such as silicon germanium or silicon carbide. In some embodiments, S/D materials 118 may include dopants such as boron, arsenic, or phosphorous. In some embodiments, the S/D materials 118 may include one or more alternate semiconductor materials such as germanium or a group III-V material or alloy. For p-type metal oxide semiconductor (PMOS) transistors, S/D materials 118 may include, for example, group IV semiconductor materials such as silicon, germanium, silicon germanium, germanium tin, or silicon germanium alloyed with carbon. Example p-type dopants in silicon, silicon germanium, and germanium include boron, gallium, indium, and aluminum. For n-type metal oxide semiconductor (NMOS) transistors, S/D materials 118 may include, for example, group III-V semiconductor materials such as indium, aluminum, arsenic, phosphorous, gallium, and antimony, with some example compounds including indium aluminum arsenide, indium arsenide phosphide, indium gallium arsenide, indium gallium arsenide phosphide, gallium antimonide, gallium aluminum antimonide, indium gallium antimonide, or indium gallium phosphide antimonide. In some embodiments, the S/D material 118 may be comprised of a thin semiconductor region (e.g., 1 nanometer to 10 nanometers in thickness) and a metal region. The thin semiconductor region may be positioned between the metal region and the channel material 106 so that the thin semiconductor region provides the interface between the channel material 106 and the S/D material 118. Such an embodiment may achieve a low barrier height between the channel material 106 and the S/D material 118, as well as low contact resistivity (due to the metal region). The metal region may include any suitable metal, such as copper, tungsten, ruthenium, cobalt, titanium, aluminum, or other metals or alloys of multiple metals. In some embodiments, this metal region may partially react with the semiconductor region to form a thin region that includes a compound of the semiconductor and metal (e.g., a silicide or germanide).

The channel material 106 may be in contact with a gate dielectric 122. In some embodiments, the gate dielectric 122 may surround the channel material 106 (e.g., when the channel material 106 includes wires, as shown in FIG. 1), while in other embodiments, the gate dielectric 122 may not surround the channel material 106 (e.g., when the channel material 106 includes a fin, as discussed below with reference to FIGS. 19 and 20). Although a single "gate dielectric 122" is used to refer to the gate dielectric present in all of the device strata 130 of the IC structures 100 disclosed herein, the material composition of the gate dielectric 122 used in different ones of the device strata 130 may differ, as desired. The gate dielectric 122 may include one layer or a stack of layers. The one or more layers may include silicon oxide, silicon dioxide, silicon carbide, and/or a high-k dielectric material. The high-k dielectric material may include elements such as hafnium, silicon, oxygen, titanium, tantalum, lanthanum, aluminum, zirconium, barium, strontium, yttrium, lead, scandium, niobium, and zinc. Examples of high-k materials that may be used in the gate dielectric 122 include, but are not limited to, hafnium oxide, hafnium silicon oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, aluminum oxide, lead scandium tantalum oxide, and lead zinc niobate. In some embodiments, an annealing process may be carried out on the gate dielectric 122 to improve its quality when a high-k material is used.

The gate dielectric 122 may be disposed between the channel material 106 and a gate metal 124. In some embodiments, the gate metal 124 may surround the channel material 106 (e.g., when the channel material 106 includes wires, as shown in FIG. 1 with respect to the channel material 106-2), while in other embodiments, the gate metal 124 may not surround the channel material 106 (e.g., when the channel material 106 includes a fin, as shown in FIG. 1 with respect to the channel material 106-1 and as discussed below with reference to FIGS. 19 and 20). In some embodiments, the material composition of the gate metal 124 used in different ones of the device strata 130 may be different; for example, FIG. 1 illustrates a gate metal 124-1 in the device stratum 130-1 and a gate metal 124-2 in the device stratum 130-2. In other embodiments, the material composition of the gate metal 124 used in different ones of the device strata 130 may be the same. Together, the gate metal 124 and the gate dielectric 122 may provide a gate for the associated channel material 106, with the electrical impedance of the channel material 106 modulated by the electrical potential applied to the associated gate (through gate contacts, not shown). The gate metal 124 may include at least one p-type work function metal or n-type work function metal, depending on whether the transistor of which it is a part is to be a PMOS or an NMOS transistor. In some implementations, the gate metal 124 may include a stack of two or more metal layers, where one or more metal layers are work function metal layers and at least one metal layer is a fill metal layer. Further metal layers may be included for other purposes, such as a barrier layer (e.g., tantalum, tantalum nitride, an aluminum-containing alloy, etc.). In some embodiments, a gate metal 124 may include a resistance-reducing cap layer (e.g., copper, gold, cobalt, or tungsten). For a PMOS transistor, metals that may be used for the gate metal 124 include, but are not limited to, ruthenium, palladium, platinum, cobalt, nickel, conductive metal oxides (e.g., ruthenium oxide), and any of the metals discussed herein with reference to an NMOS transistor (e.g., for work function tuning). For an NMOS transistor, metals that may be used for the gate metal 124 include, but are not limited to, hafnium, zirconium, titanium, tantalum, aluminum, alloys of these metals, carbides of these metals (e.g., hafnium carbide, zirconium carbide, titanium carbide, tantalum carbide, and aluminum carbide), and any of the metals discussed above with reference to a PMOS transistor (e.g., for work function tuning). In some embodiments, the gate metal 124 may include grading (increasing or decreasing) of the concentration of one or more materials therein. Spacers 116 may separate the gate metal 124 from the proximate S/D material 118. The spacers 116 may include silicon nitride, silicon oxide, silicon carbide, silicon nitride doped with carbon, silicon oxynitride, or silicon oxynitride doped with carbon, for example. Together, a channel material 106, gate dielectric 122, gate metal 124, and associated S/D materials 118 may provide a transistor.

In the IC structure 100 of FIG. 1 (and in others of the accompanying drawings), the width 136-1 of the channel material 106-1 may be different than the width 136-2 of the channel material 106-2. As used herein, the width 136 of a channel material 106 refers to the dimension of the channel material 106 that is perpendicular to the longitudinal axis of the channel material 106 running from the S/D material 118 at one end of the channel material 106 to the S/D material 118 at the other end of the channel material 106, and parallel to the surface of the base 102, as shown in various ones of the accompanying figures. More generally, the widths 136 of the channel material 106 in two different ones of the device strata 130 in an IC structure 100 may be different. In the embodiment of FIG. 1, the width 136-1 of the channel material 106-1 is less than the width 136-2 of the channel material 106-2, but in other embodiments (e.g., as discussed below with reference to FIG. 19), the width 136-2 of the channel material 106-2 may be less than the width 136-1 of the channel material 136-1. In some embodiments, the width 136 of a channel material 106 may be between 5 nanometers and 30 nanometers. In some embodiments, the width 136 of the channel material 106 in a device stratum 130 having "wider" channel material 106 may be between 10 nanometers and 30 nanometers, while the width 136 of the channel material 106 in a device stratum 130 having "narrower" channel material 106 may be between 5 nanometers and 10 nanometers (e.g., between 5 nanometers and 6 nanometers). For example, the width 136-1 of the fin-shaped channel material 106-1 in the embodiment of FIG. 1 may be between 5 nanometers and 10 nanometers (e.g., between 5 nanometers and 6 nanometers) and the width 136-2 of the wire-shaped channel material 106-2 in the embodiment of FIG. 1 may be between 10 nanometers and 30 nanometers.

Allowing the width 136 of the channel material 106 in different ones of the device strata 130 to differ from each other may enable the dimensions of the transistors in the device strata 130 to be tuned for improved performance. For example, when a PMOS transistor in a device stratum 130 includes a silicon or germanium (or silicon germanium) channel material 106, the channel material 106 may be preferably shaped as a fin to take advantage of the improved carrier transport in the (110) sidewall of such materials. An NMOS transistor in a different device stratum 130 may preferably include a III-V channel material 106; because III-V material systems may have a lighter effective mass (and may exhibit more difficulty in limiting off-state leakage relative to silicon/germanium channels), such III-V channel material 106 may be preferably shaped as a wire (e.g., a nanowire or nanoribbon). However, if the width 136 of the fin-shaped silicon/germanium channel material 106 is constrained to be equal to the width 136 of the wire-shaped III-V channel material 106, selecting this width 136 may require performance tradeoffs between the PMOS and NMOS transistors (e.g., increasing the width 136 may improve performance of the III-V NMOS transistor while hurting the performance of the silicon/germanium PMOS transistor). The IC structures 100 disclosed herein include channel material 106 having widths 136 that may differ across different device strata 130, allowing a desired width 136 to be achieved for the particular geometry (e.g., fins versus wires) and materials (e.g., silicon/germanium versus III-V) of the device strata 130, and thus improved performance relative to conventional approaches.

Other dimensions of the elements of the IC structure 100 may take any suitable values. In some embodiments, the thickness 140 of the channel material 106 may be between 1 nanometer and 500 nanometers (e.g., between 40 nanometers and 400 nanometers when the channel material 106 is a fin, and between 5 nanometers and 40 nanometers when the channel material 106 is a wire). In some embodiments, the thickness 138 of the spacers 116 may be between 6 nanometers and 12 nanometers. In some embodiments in which a device stratum 130 includes semiconductor wires, the spacing 142 between adjacent ones of the wires may be between 5 nanometers and 40 nanometers. In some embodiments, the spacing 144 between channel material 106 of one device stratum 130 and channel material 106 of an adjacent device stratum 130 in the same device stack 128 may be between 5 nanometers and 50 nanometers. In some embodiments in which a device stratum 130 includes semiconductor wires as the channel material 106, the spacing 142 between adjacent instances of the wires may not be constant between each wire.

In some embodiments, the IC structure 100 may be part of a memory device, and transistors of the IC structure 100 may store information in the IC structure 100 or facilitate access to (e.g., read and/or write) storage elements of the memory device. In some embodiments, the IC structure 100 may be part of a processing device. In some embodiments, the IC structure 100 may be part of a device that includes memory and logic devices (e.g., in a single die 1502, as discussed below), such as a processor and cache. More generally, the IC structures 100 disclosed herein may be part of memory devices, logic devices, or both.

FIGS. 2-16 illustrate stages in an example process for manufacturing the IC structure 100 of FIG. 1. Although the operations of the process may be illustrated with reference to particular embodiments of the IC structures 100 disclosed herein, the process of FIGS. 2-16 and variants thereof may be used to form any suitable IC structure 100 (e.g., the IC structures 100 illustrated in FIGS. 17-21). Operations are illustrated a particular number of times and in a particular order in FIGS. 2-16, but the operations may be reordered and/or repeated as desired (e.g., with different operations performed in parallel when manufacturing multiple IC structures 100 simultaneously).

FIG. 2 illustrates an assembly 200 including a base 102 and a stack of material layers on the base 102. The stack of material layers may include a set of layers corresponding to the device stratum 130-1 and a set of layers corresponding to the device stratum 130-2. The set of layers corresponding to the device stratum 130-1 may include layers of the channel material 106-1 spaced apart from each other (and from the base 102, as appropriate) by intervening layers of sacrificial material 104. Similarly, the set of layers corresponding to the device stratum 130-2 may include layers of the channel material 106-2 spaced apart from each other (and from the layers of the device stratum 130-1) by intervening layers of sacrificial material 104. The size and arrangement of the material layers in the assembly 200 corresponds to the desired size and arrangement of the channel material 106 in the IC structure 100, as will be discussed further below, and thus the material layers in the assembly 200 may vary from the particular embodiment illustrated in FIG. 2. The sacrificial material 104 may be any material that may be appropriately selectively removed in later processing operations (as discussed below with reference to FIG. 9). The assembly 200 may be formed using any suitable deposition techniques, such as chemical vapor deposition (CVD), physical vapor deposition (PVD), atomic layer deposition (ALD), or a layer transfer process.

Figure 3A:
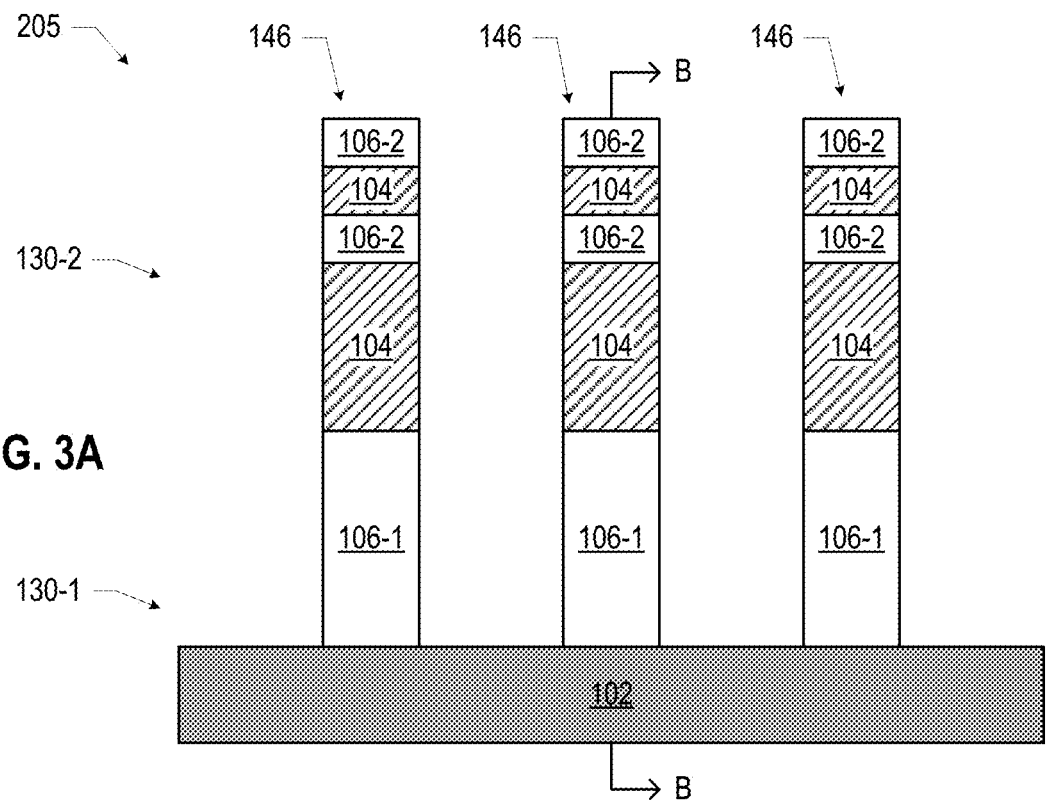
Figure 3B:
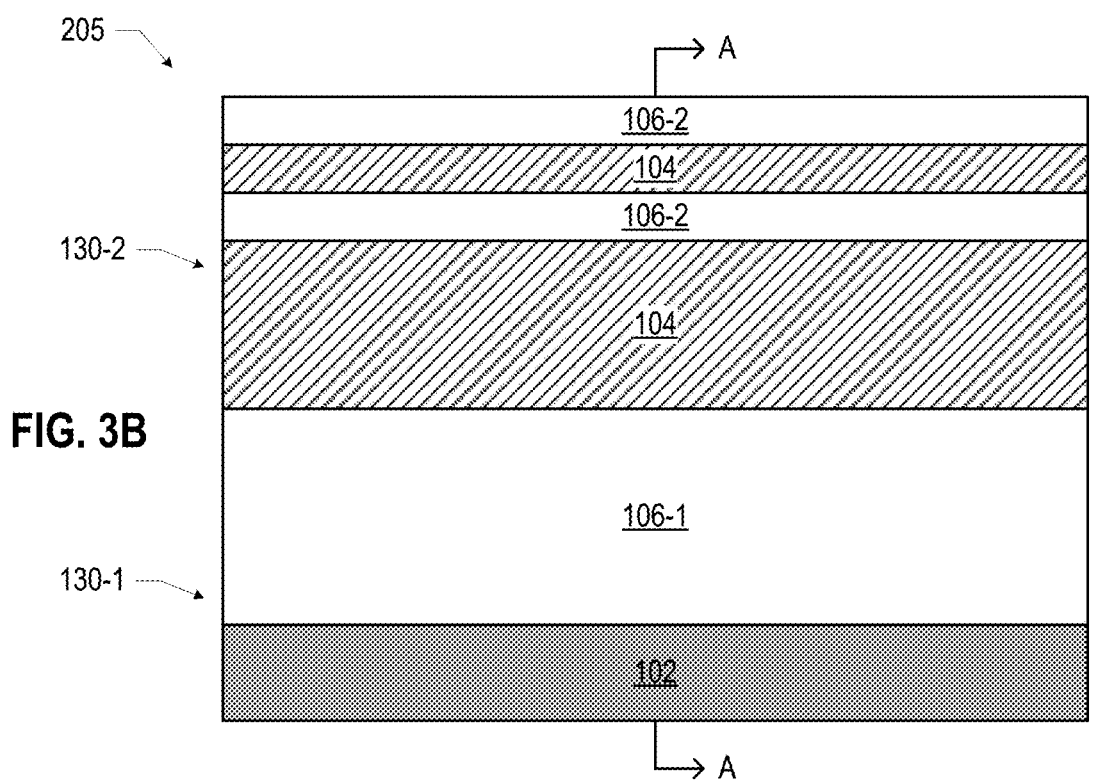

FIG. 3 illustrates an assembly 205 subsequent to forming fins 146 in the material stack of the assembly 200 (FIG. 2). Standard masking and etch techniques may be used to form the fins 146, including wet and/or dry etch schemes, as well as isotropic and/or anisotropic etch schemes. The width of the fins 146 may be equal to the largest one of the widths 136 of the channel materials 106 discussed above; as discussed further below, the widths of some of the channel material 106 may be reduced by oxidative thinning. Any suitable number of fins 146 may be included in the assembly 205 (e.g., more or fewer than 3). Although the fins 146 depicted in FIG. 3 (and others of the accompanying drawings) are perfectly rectangular, this is simply for ease of illustration, and in practical manufacturing settings, the shape of the fins 146 may not be perfectly rectangular. For example, the fins 146 may be tapered, widening toward the base 102. The top surface of the fins 146 may not be flat, but may be curved, rounding into the side surfaces of the fins 146. Examples of IC structures 100 including some such non-idealities are discussed below with reference to FIG. 21.

Figure 4A:
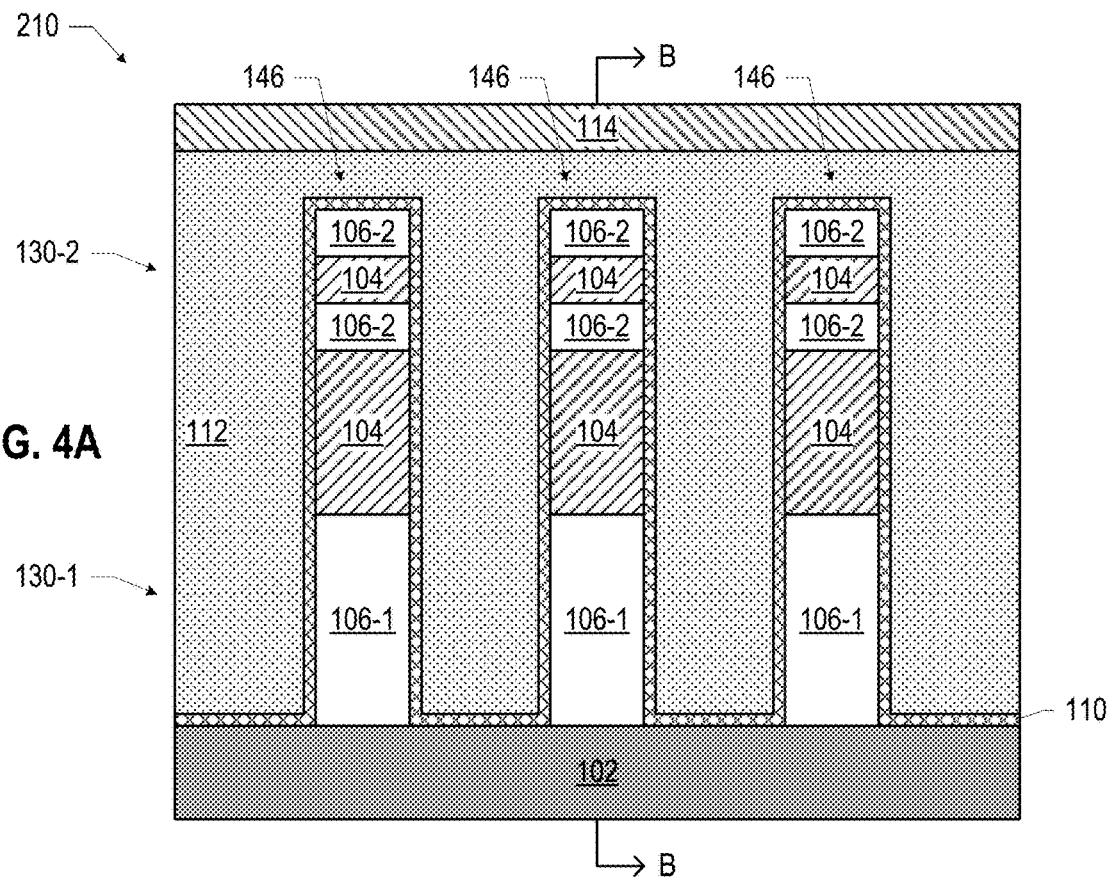
Figure 4B:
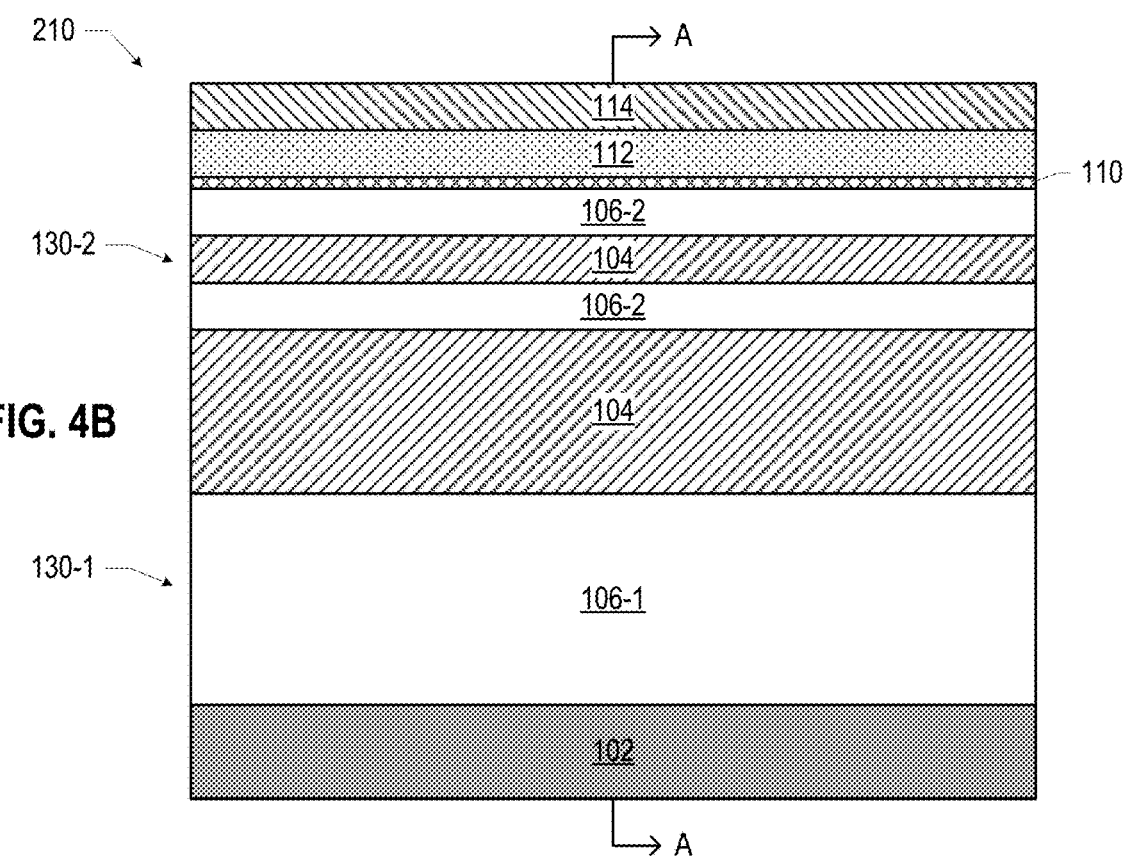

FIG. 4 illustrates an assembly 210 subsequent to forming a conformal layer of the dummy gate dielectric 110 over the assembly 205 (FIG. 3), forming a dummy gate metal 112, and then depositing a hardmask 114. The dummy gate metal 112 may extend over the top surfaces of the fins 146, as shown. The dummy gate dielectric 110 may be formed by any suitable technique (e.g., ALD), and the dummy gate metal 112 and hardmask 114 may be formed using any suitable techniques. The dummy gate dielectric 110 and the dummy gate metal 112 may include any suitable materials (e.g., silicon oxide and polysilicon, respectively). The hardmask 114 may include any suitable materials (e.g., silicon nitride, carbon-doped silicon oxide, or carbon-doped silicon oxynitride).

Figure 5A:
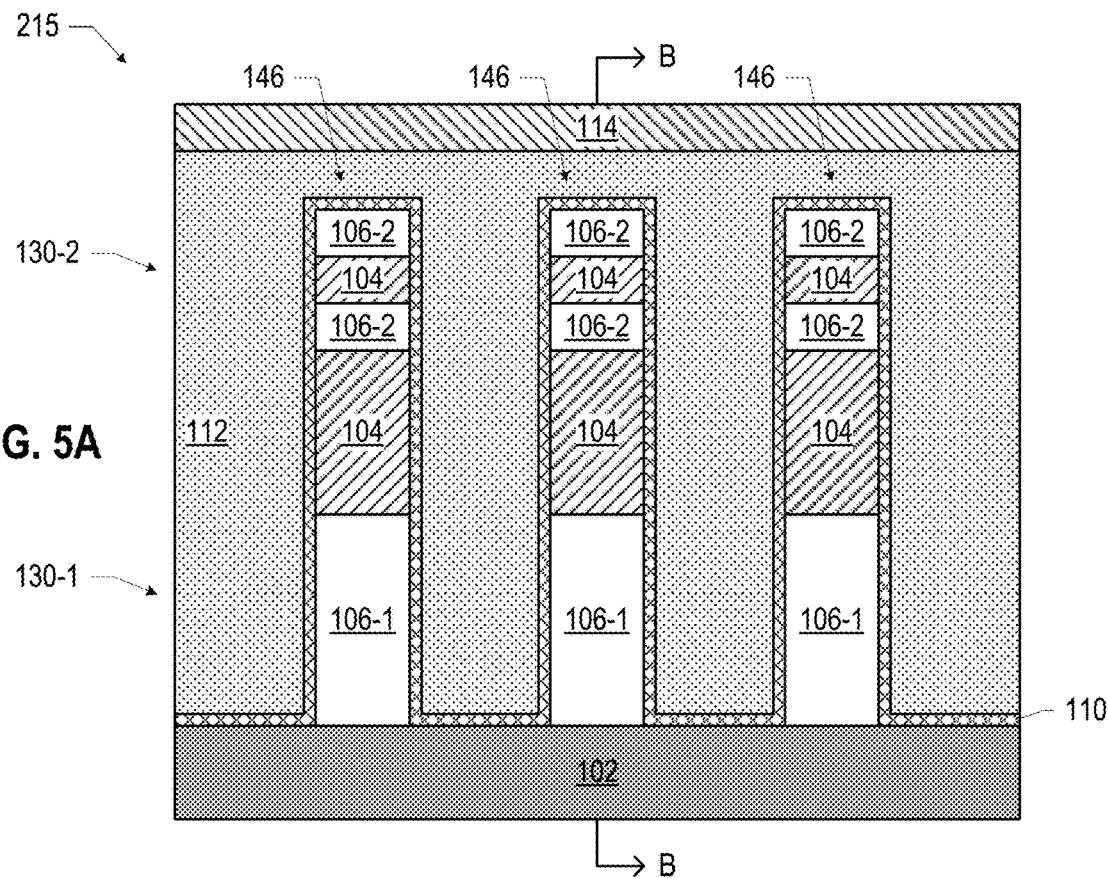
Figure 5B:
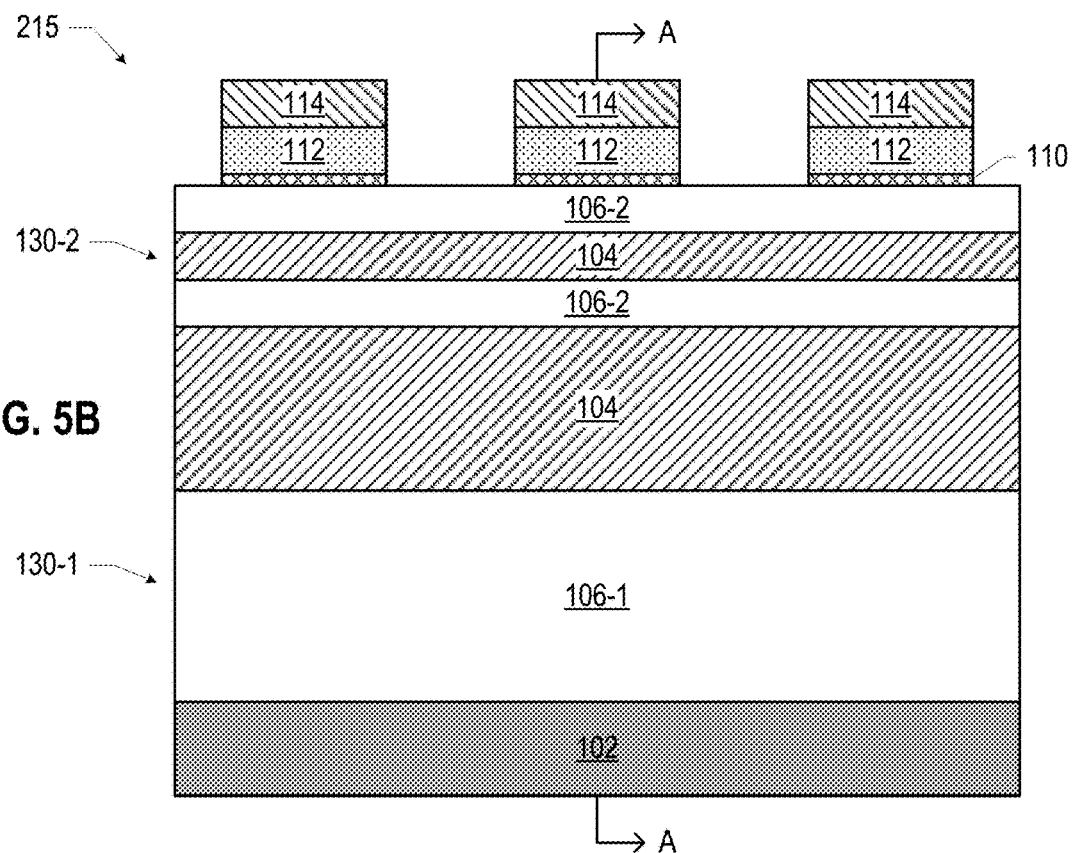

FIG. 5 illustrates an assembly 215 subsequent to patterning the hardmask 114 of the assembly 210 (FIG. 4) into strips that are oriented perpendicular to the longitudinal axis of the fins 146 (into and out of the page in accordance with the perspective of FIG. 5), and then etching the dummy gate metal 112 and dummy gate dielectric 110 using the patterned hardmask 114 as a mask. The locations of the remaining dummy gate metal 112 and dummy gate dielectric 110 may correspond to the locations of the gates in the IC structure 100, as discussed further below.

Figure 6A:
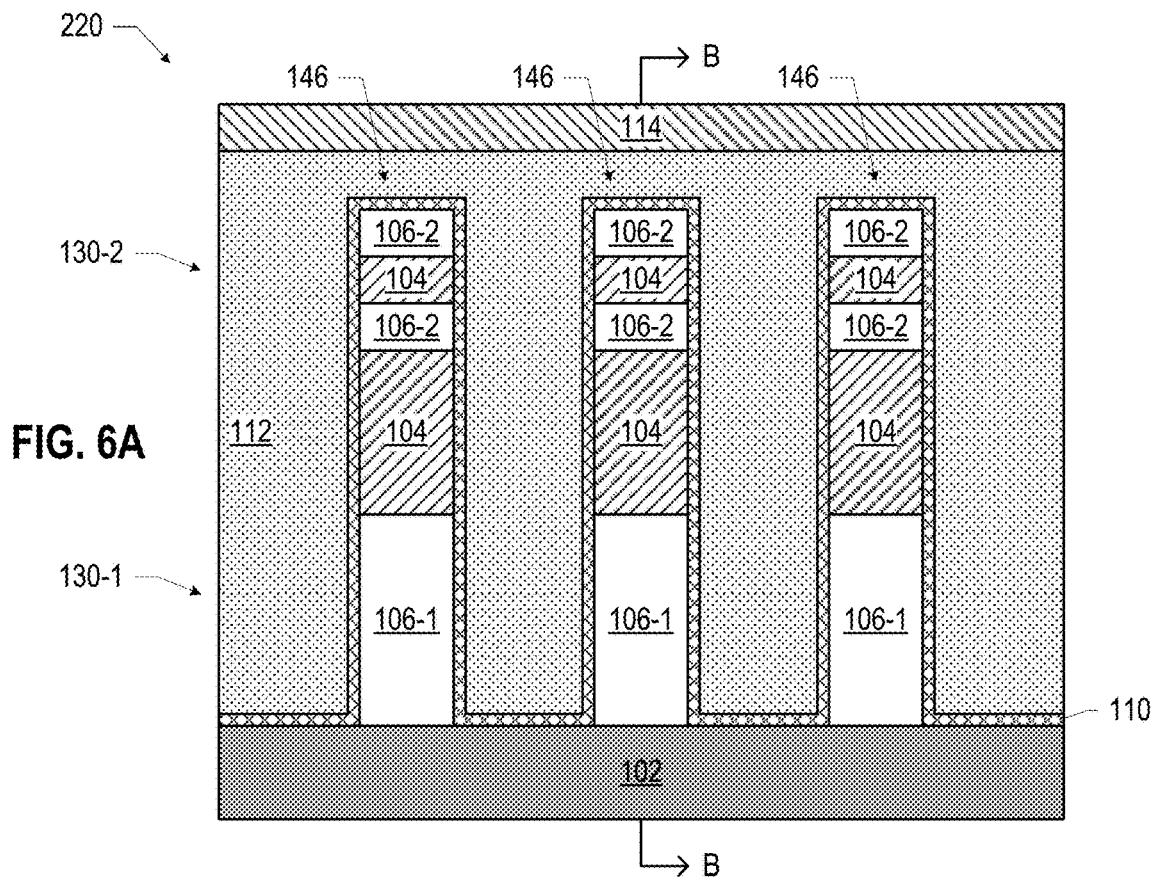
Figure 6B:
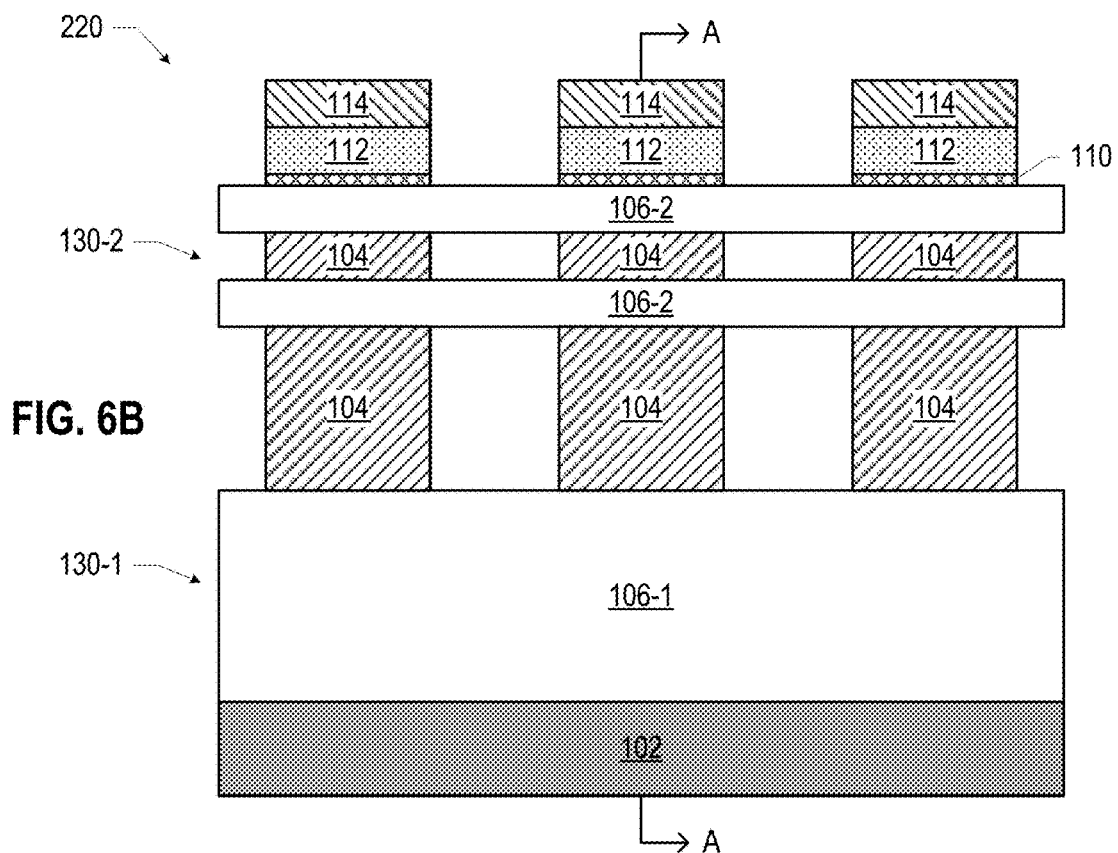

FIG. 6 illustrates an assembly 220 subsequent to removing the sacrificial material 104 that is not covered by the dummy gate metal 112 and dummy gate dielectric 110 in the assembly 215 (FIG. 5). Any suitable selective etch technique may be used to remove the sacrificial material 104.

Figure 7A:
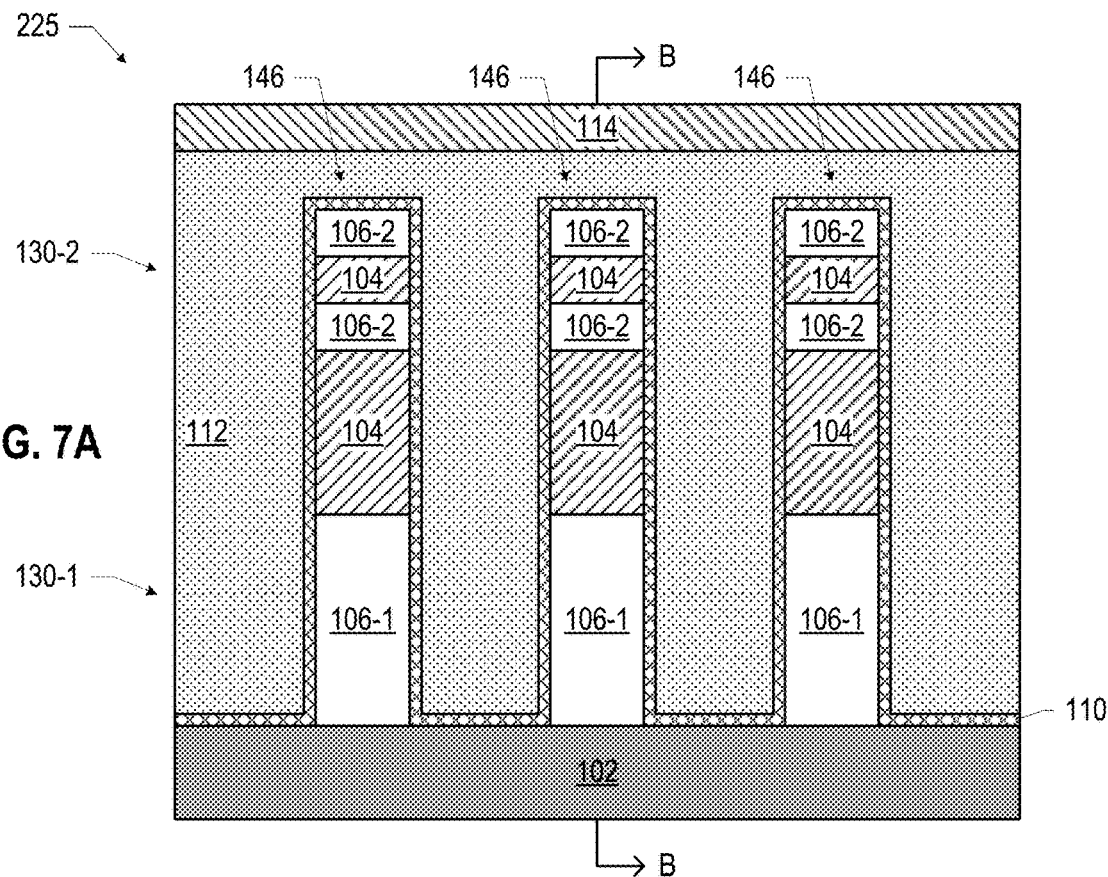
Figure 7B:
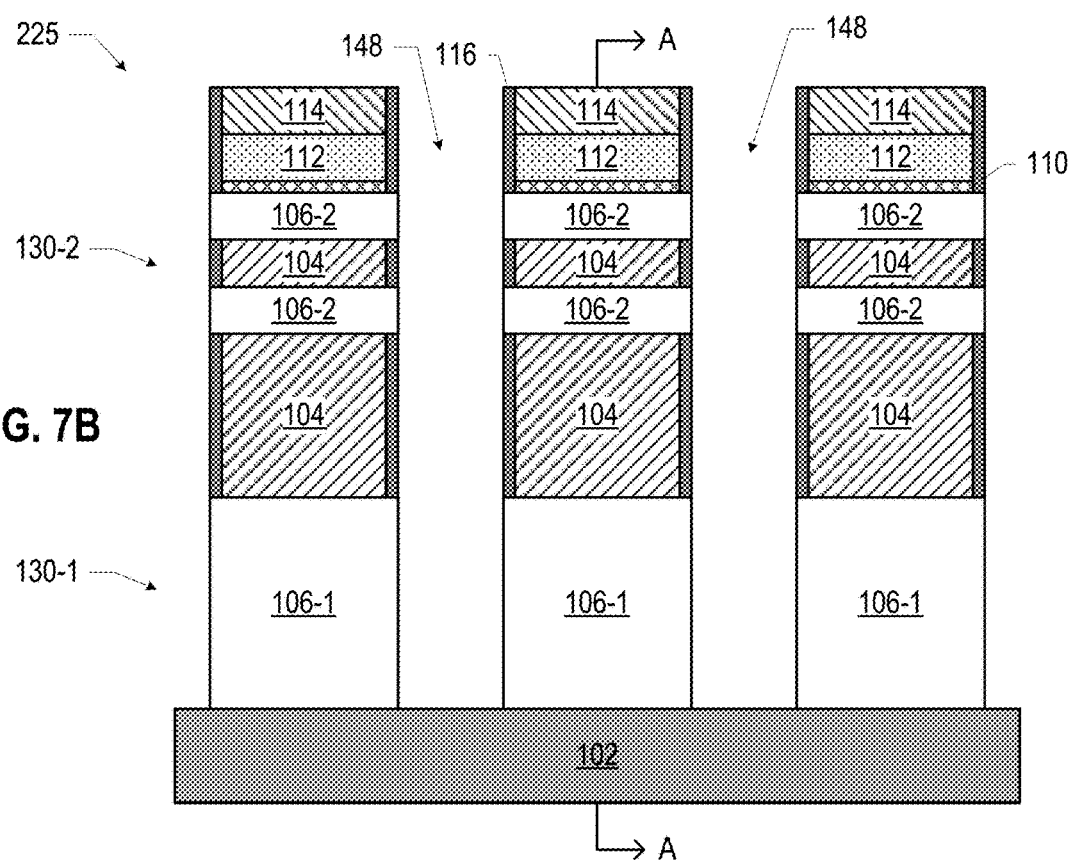

FIG. 7 illustrates an assembly 225 subsequent to forming spacers 116 on side faces of the hardmask 114, dummy gate metal 112, and dummy gate dielectric 110 of the assembly 220 (FIG. 6), and then removing the channel material 106 that is not covered by the dummy gate metal 112, the dummy gate dielectric 110, or spacers 116 to form open volumes 148. In some embodiments, the "exposed" channel material 106 may not be fully removed in the assembly 225; instead, "stubs" may extend into the open volumes 148, and will ultimately extend into the S/D material 118 in the IC structure 100, as discussed below with reference to FIG. 18. The spacers 116 may be formed by conformally depositing the material of the spacers 116 on the assembly 220, then directionally etching this material "downwards" to leave the spacers 116 on "vertical" surfaces of the assembly 220 while removing it from "horizontal" surfaces.

Figure 8A:
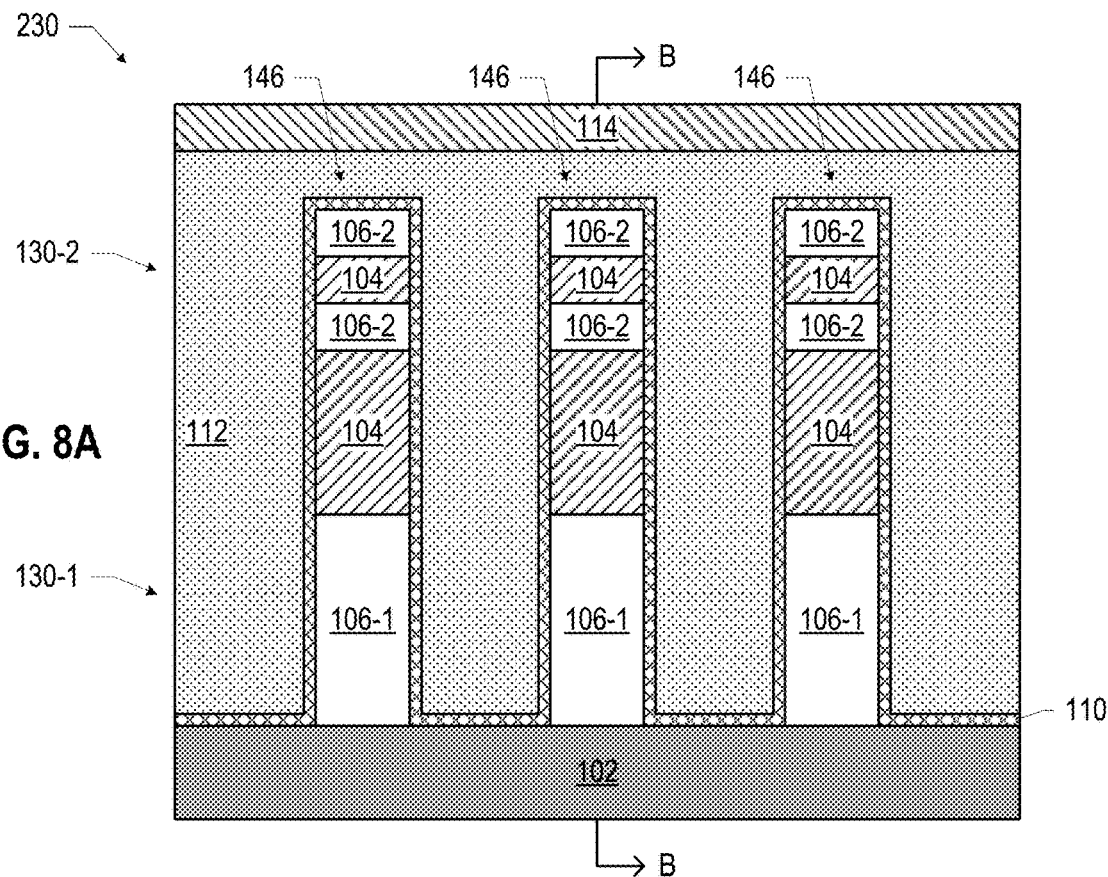
Figure 8B:
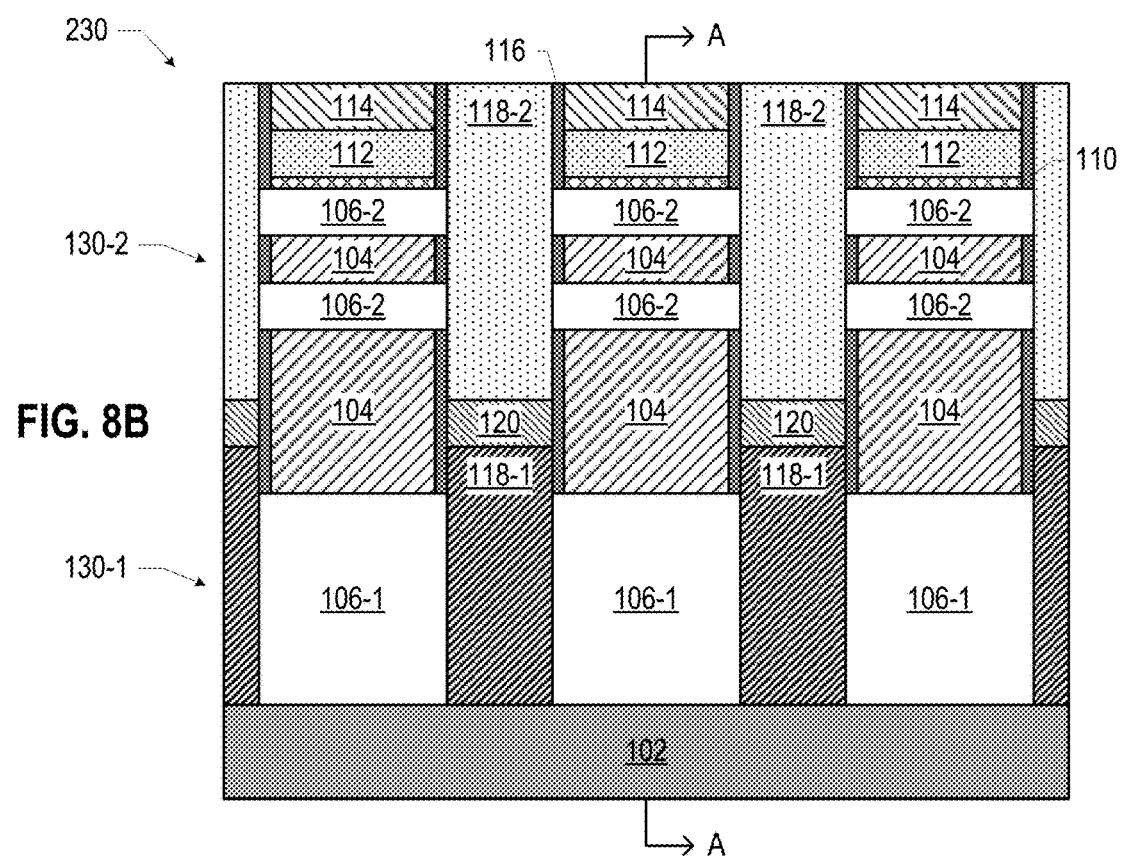

FIG. 8 illustrates an assembly 230 subsequent to forming S/D material 118-1 in the open volumes 148 in the device strata 130-1 of the assembly 225 (FIG. 7), forming an insulating material 120 on the S/D material 118-1, and then forming S/D material 118-2 in the open volumes 148 in the device strata 130-2. As discussed further below with reference to FIG. 17, the insulating material 120 may be patterned so as to only be selectively present between various portions of the S/D material 118-1 and the S/D material 118-2. The S/D material 118 may be formed by epitaxial growth. For example, the S/D material 118 may be faceted and overgrown from a trench in an underlying insulator (e.g., a shallow trench isolation material that may be part of the base 102). In some embodiments, the S/D material 118 may be a multilayer structure (e.g., a germanium cap on a silicon germanium body, or a germanium body and a carbon-containing silicon germanium spacer or liner between the channel material 106 and the germanium body). In some embodiments, a portion of the S/D material 118 may have a component that is graded in composition (e.g., a graded germanium concentration to facilitate lattice matching, or a graded dopant concentration to facilitate low contact resistance).

Figure 9A:
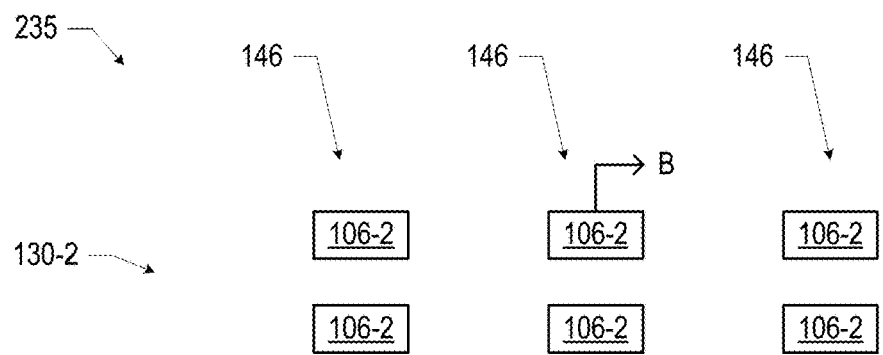
Figure 9B:
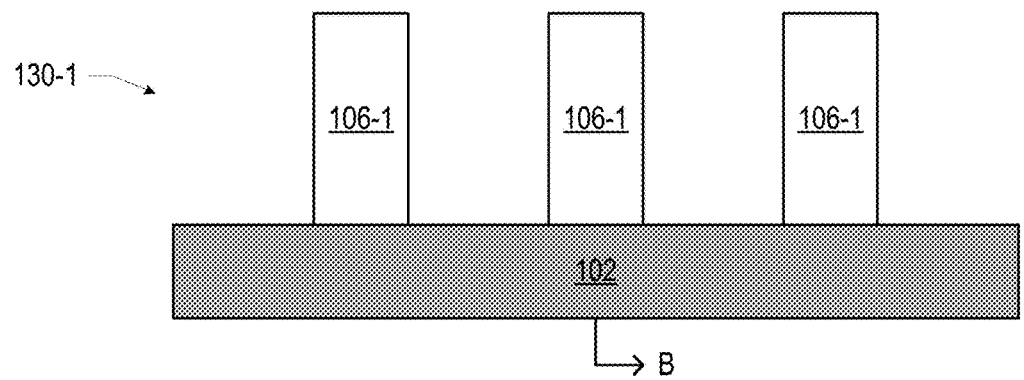
Figure 9B:
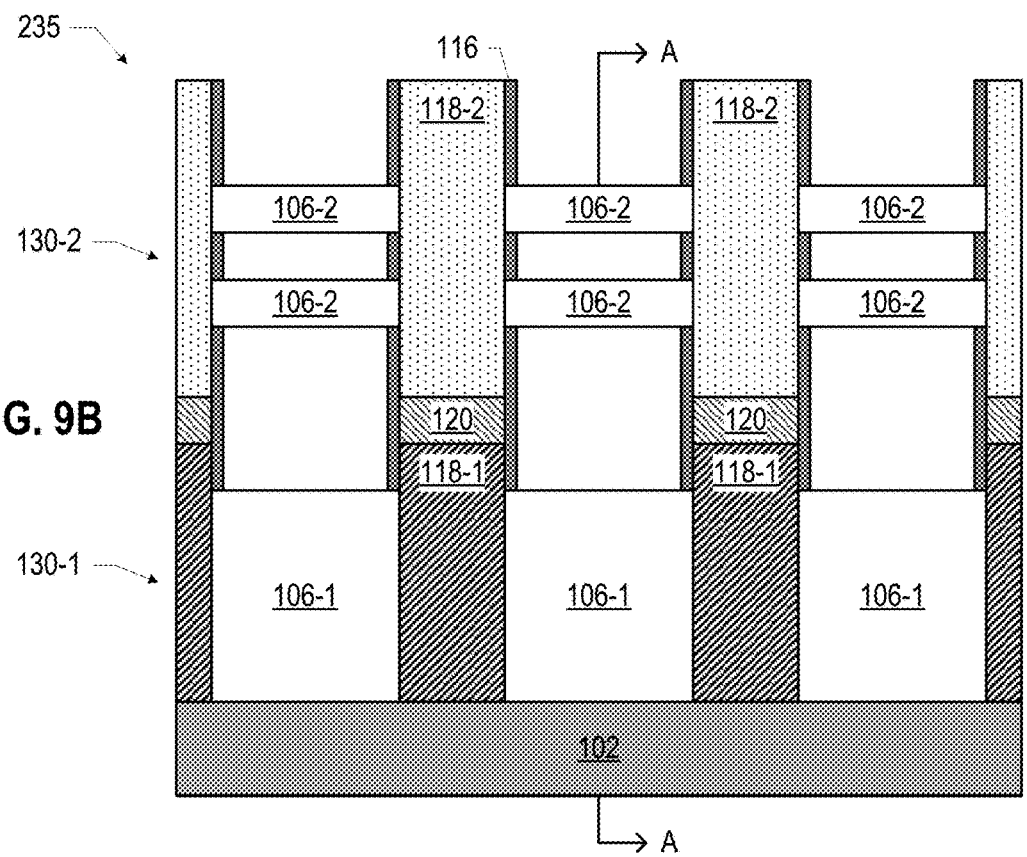

FIG. 9 illustrates an assembly 235 subsequent to removing the hardmask 114, the dummy gate dielectric 110, and the dummy gate metal 112 from the assembly 230 (FIG. 8). Any suitable etch processes may be used to remove the hardmask 114, the dummy gate dielectric 110, and the dummy gate metal 112.

Figure 10A:
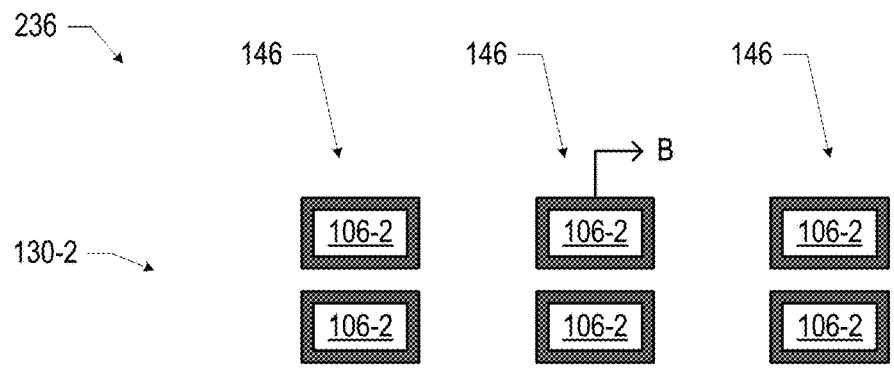
Figure 10B:
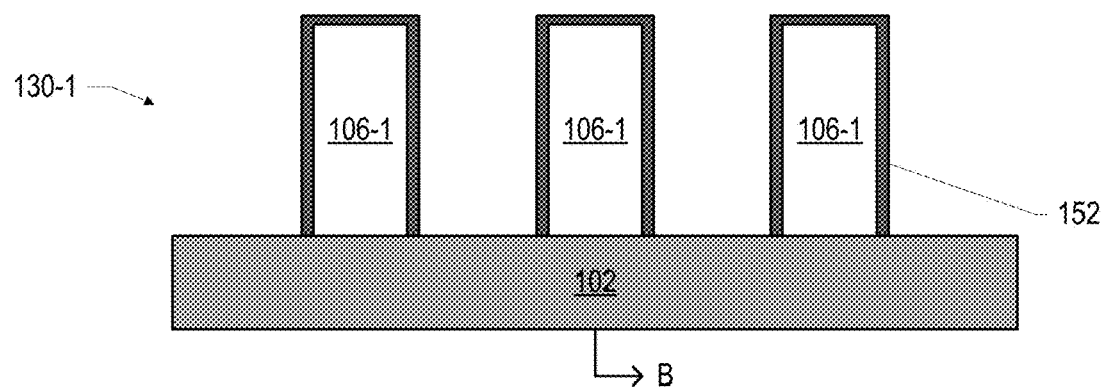
Figure 10B:
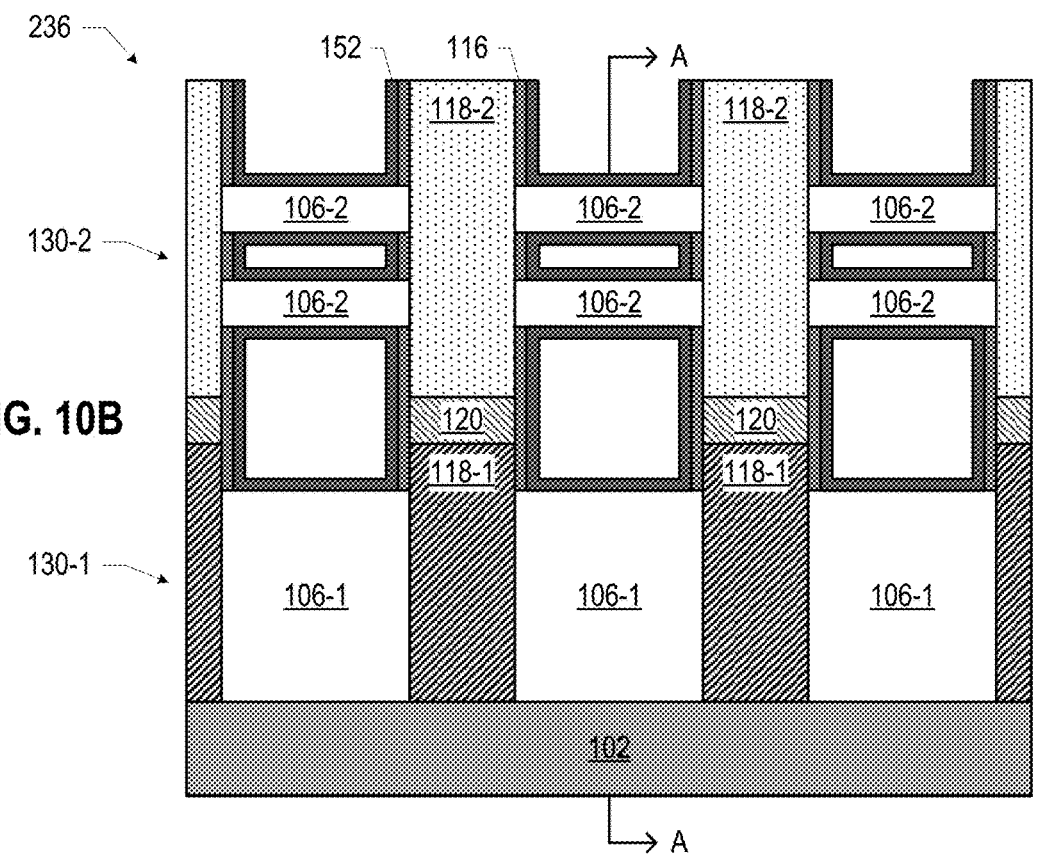

FIG. 10 illustrates an assembly 236 subsequent to depositing a layer of oxidation catalyst 152 on the exposed channel materials 106 of the assembly 235 (FIG. 9). The oxidation catalyst 152 may be any material that increases the rate of oxidation of the underlying material when exposed to a desired set of conditions (e.g., during an anneal). In some embodiments, the oxidation catalyst 152 may include a metal, such as aluminum, and the particular material composition of the oxidation catalyst 152 may depend on the underlying channel material 106 to be oxidized, as known in the art. The thickness of the oxidation catalyst 152 may take any suitable value (e.g., 1 nanometer). The deposition of the oxidation catalyst 152 may be a conformal process (e.g., ALD).

FIG. 11 illustrates an assembly 237 subsequent to forming a hardmask 154 to cover the channel material 106-1 (and the adjacent oxidation catalyst 152) of the device stratum 130-1 of the assembly 236 (FIG. 10). The hardmask 154 may be initially deposited to cover all of the channel material 106 (and the adjacent oxidation catalyst 152), and then may be recessed back, as desired. The oxidation catalyst 152 adjacent to the channel material 106-2 may be exposed in the assembly 237, as shown.

FIG. 12 illustrates an assembly 238 subsequent to removing the oxidation catalyst 152 that is not protected by the hardmask 154 in the assembly 237 (FIG. 11). The oxidation catalyst 152 may be removed by any suitable process, such as a wet clean.

Figure 13A:
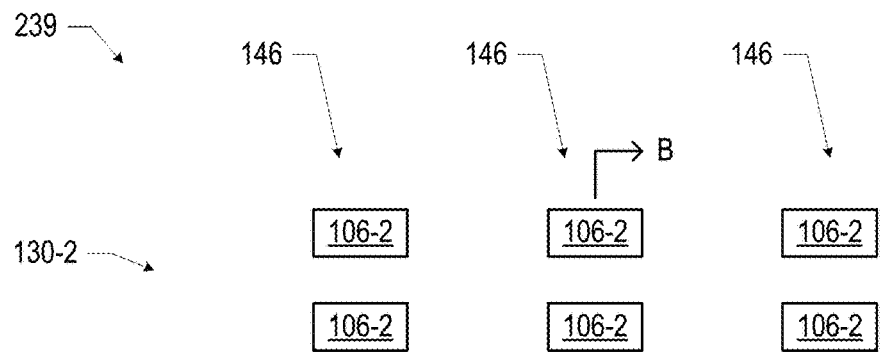
Figure 13B:
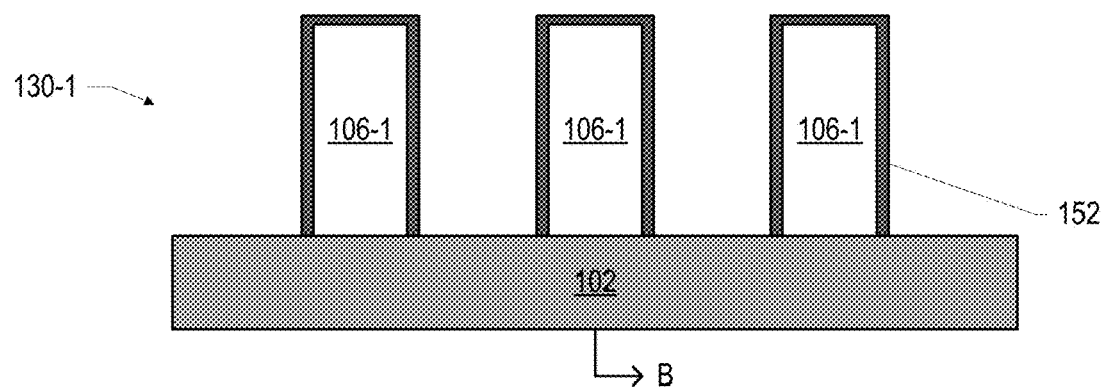
Figure 13B:
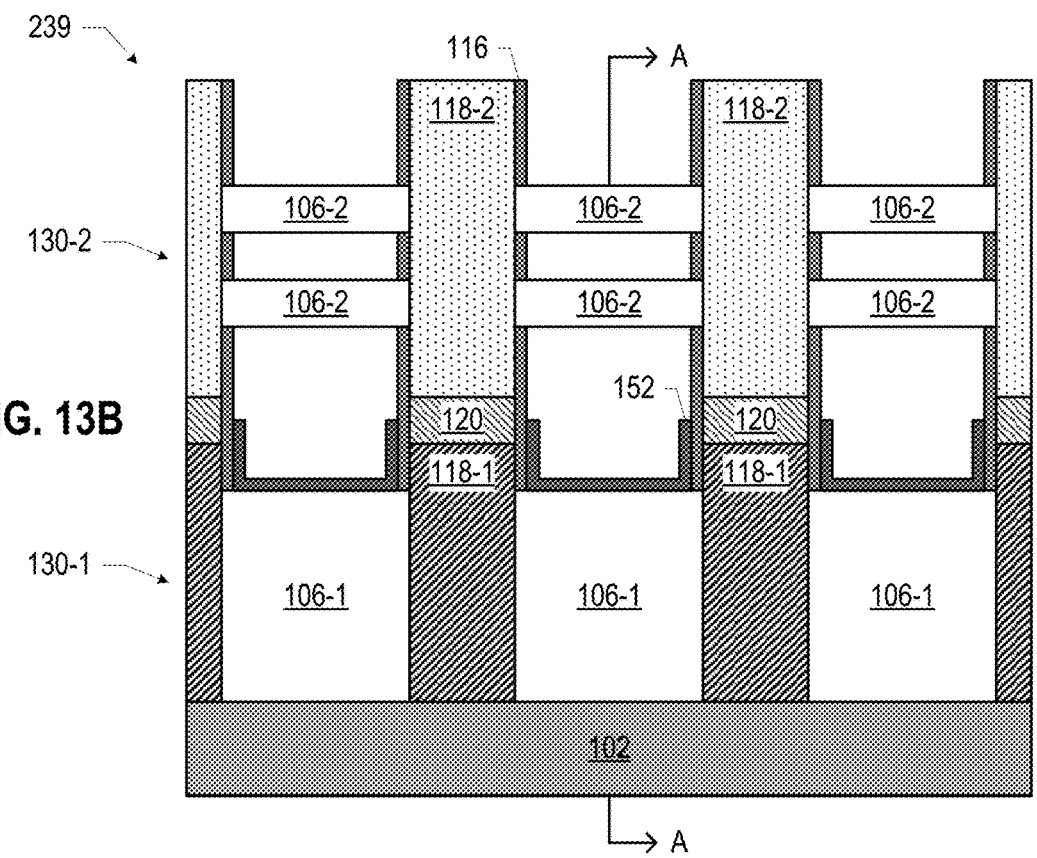

FIG. 13 illustrates an assembly 239 subsequent to removing the hardmask 154 from the assembly 238 (FIG. 12). The hardmask 154 may be removed using any suitable technique. The oxidation catalyst 152 remains adjacent to the channel material 106-1 in the assembly 239 (but no oxidation catalyst 152 may be adjacent to the channel material 106-2).

Figure 14A:
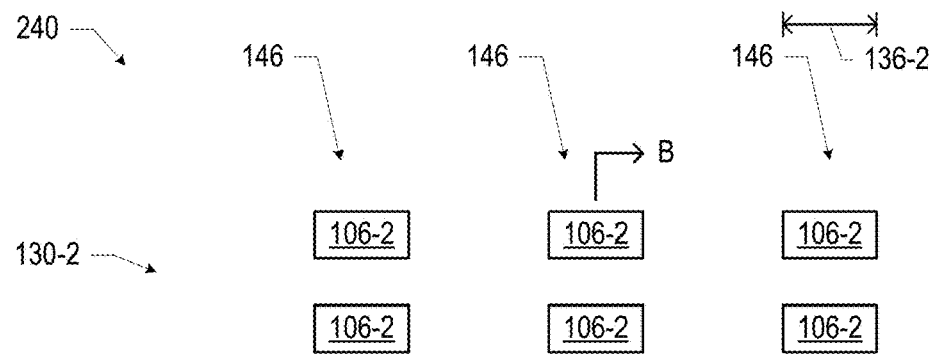
Figure 14B:
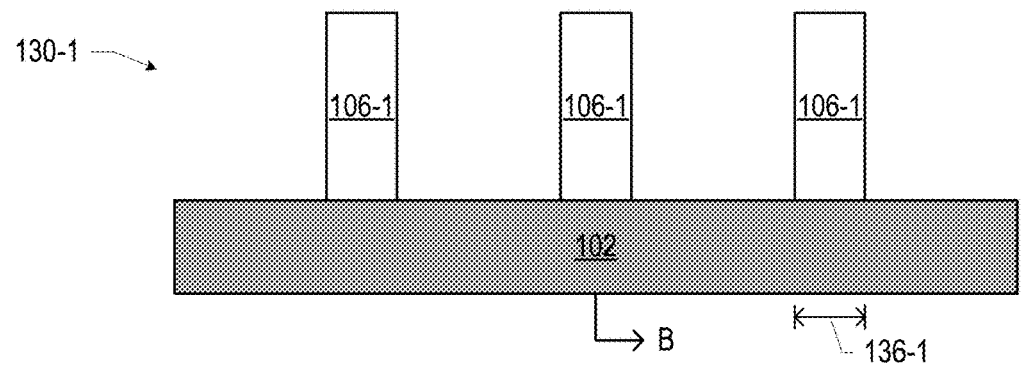
Figure 14B:
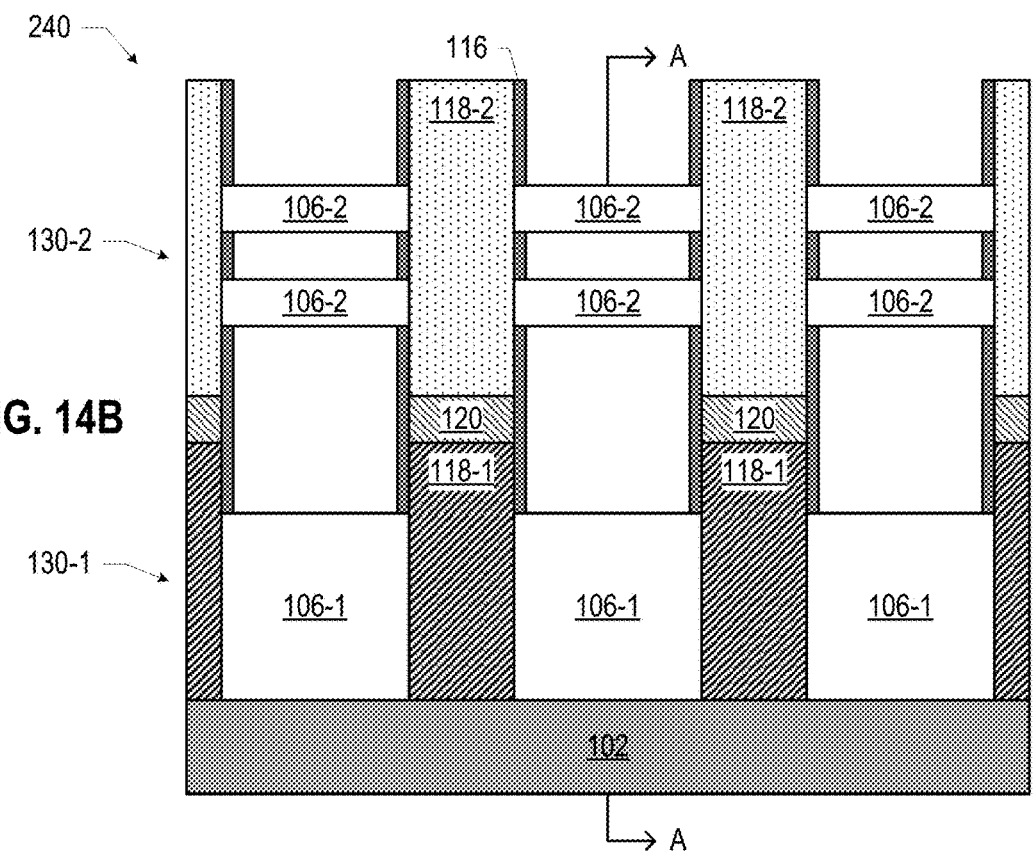

FIG. 14 illustrates an assembly 240 subsequent to annealing the assembly 239 (FIG. 13) to oxidize the outer portions of the channel material 106-1, and then cleaning away any remaining oxidation catalyst 152 and the oxidized channel material 106-1 (e.g., using a wet clean). Subsequent to this oxidation and cleaning process, the channel material 106-1 may be thinned, having a reduced width 136-1 relative to the width 136-2 of the channel material 106-2. The height of the channel material 106-1 may also be reduced relative to its previous height (due to oxidation of the top surface of the channel material 106-1). The channel material 106-2 may be oxidized little, if at all, during the annealing process, and thus the width 136-2 of the channel material 106-2 may be substantially the same as it was prior to the anneal. FIGS. 10-14 illustrate a particular process for selectively thinning the channel material 106-1 relative to the channel material 106-2, but other processes may be used. For example, if the channel material 106-2 is to be selectively thinned relative to the channel material 106-1 (e.g., as discussed below with reference to FIG. 19), an alternate process may be used in which the hardmask 154 is deposited before deposition of the oxidation catalyst 152 (to cover the channel material 106-1) and then the oxidation catalyst 152 is deposited on the exposed channel material 106-2 (followed by an anneal and clean).

Alternately, in embodiments in which the oxidation catalyst 152 is selected to enhance the oxidation of the channel material 106-1 without enhancing the oxidation of the channel material 106-2 (e.g., due to different material compositions of the channel material 106-1 and the channel material 106-2) or vice versa, the masking operations of FIGS. 11-13 need not be performed; instead, the oxidation catalyst 152 may be deposited over the channel materials 106-1 and 106-2 as discussed with reference to FIG. 10, and an anneal and clean may be performed as discussed with reference to FIG. 14. The channel material 106-2 may not appreciably oxidize in the presence of the oxidation catalyst 152, while the channel material 106-1 may oxidize and "thin," as discussed above. Such an embodiment may be particularly useful when the channel material 106-1 is made of a different materials system than the channel material 106-2 (e.g., silicon/germanium versus III-V materials).

Figure 15A:
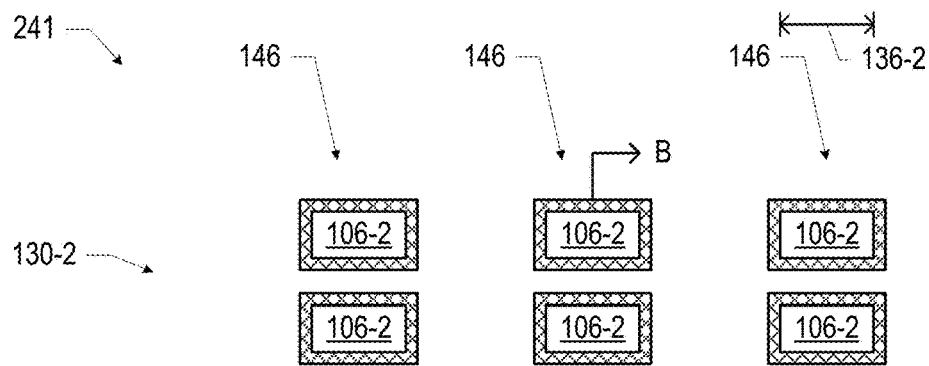
Figure 15B:
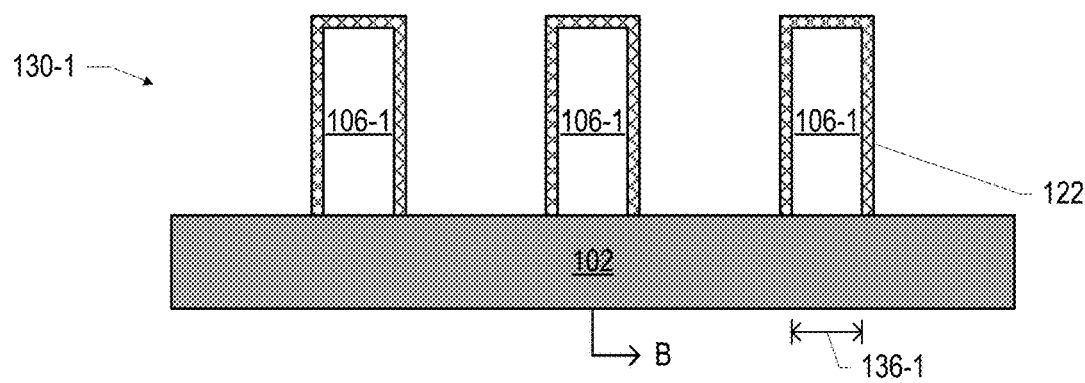
Figure 15B:
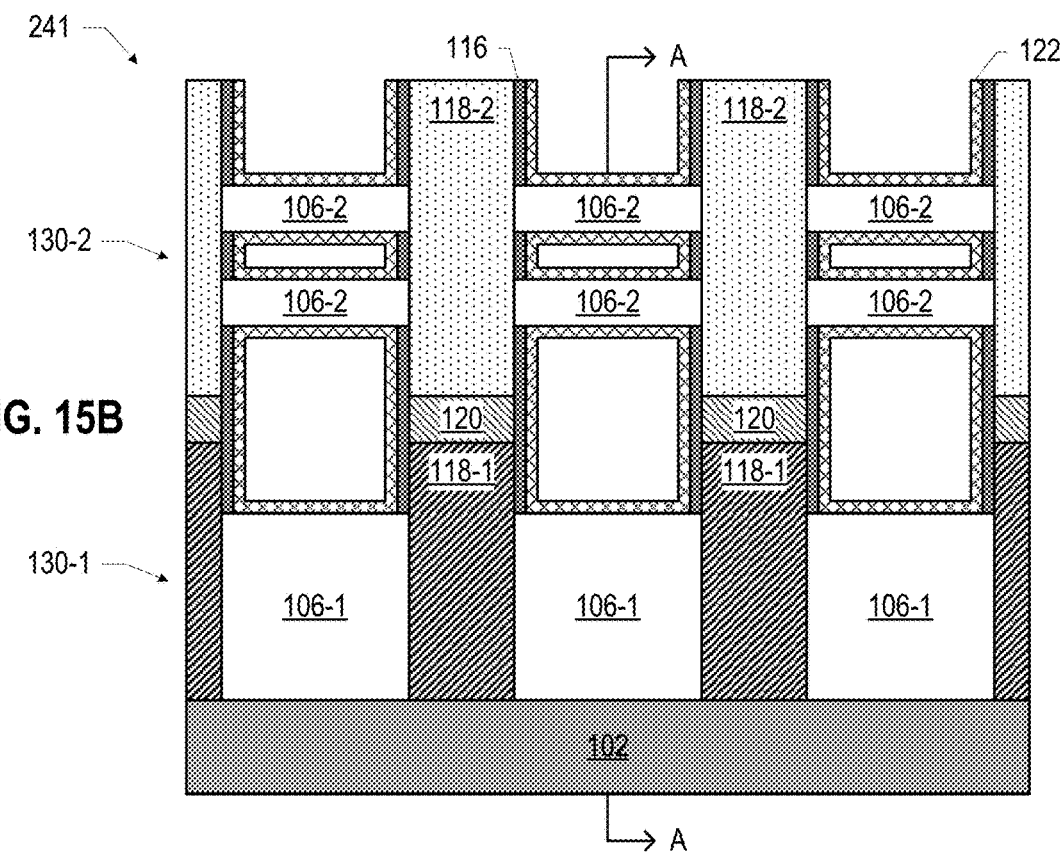

FIG. 15 illustrates an assembly 241 subsequent to forming a conformal layer of the gate dielectric 122 over the assembly 235 (FIG. 9). In embodiments in which the gate dielectric 122 in the device stratum 130-1 is different than the gate dielectric 122 in the device stratum 130-2, the gate dielectric 122 for the device stratum 130-1 may be initially formed, a sacrificial material may be deposited to cover the gate dielectric 122 in the device stratum 130-1, the initially formed gate dielectric 122 in the device stratum 130-2 may be removed, a new gate dielectric 122 for the device stratum 130-2 may be formed, and then the sacrificial material may be removed. In some embodiments, the gate dielectric 122 in the device stratum 130-1 has the same material composition as the gate dielectric 122 in the device stratum 130-2, but with different thicknesses. For example, a relatively thicker gate dielectric 122 may be used for a high voltage transistor, while a relatively thinner gate dielectric may be used for a logic transistor.

Figure 16A:
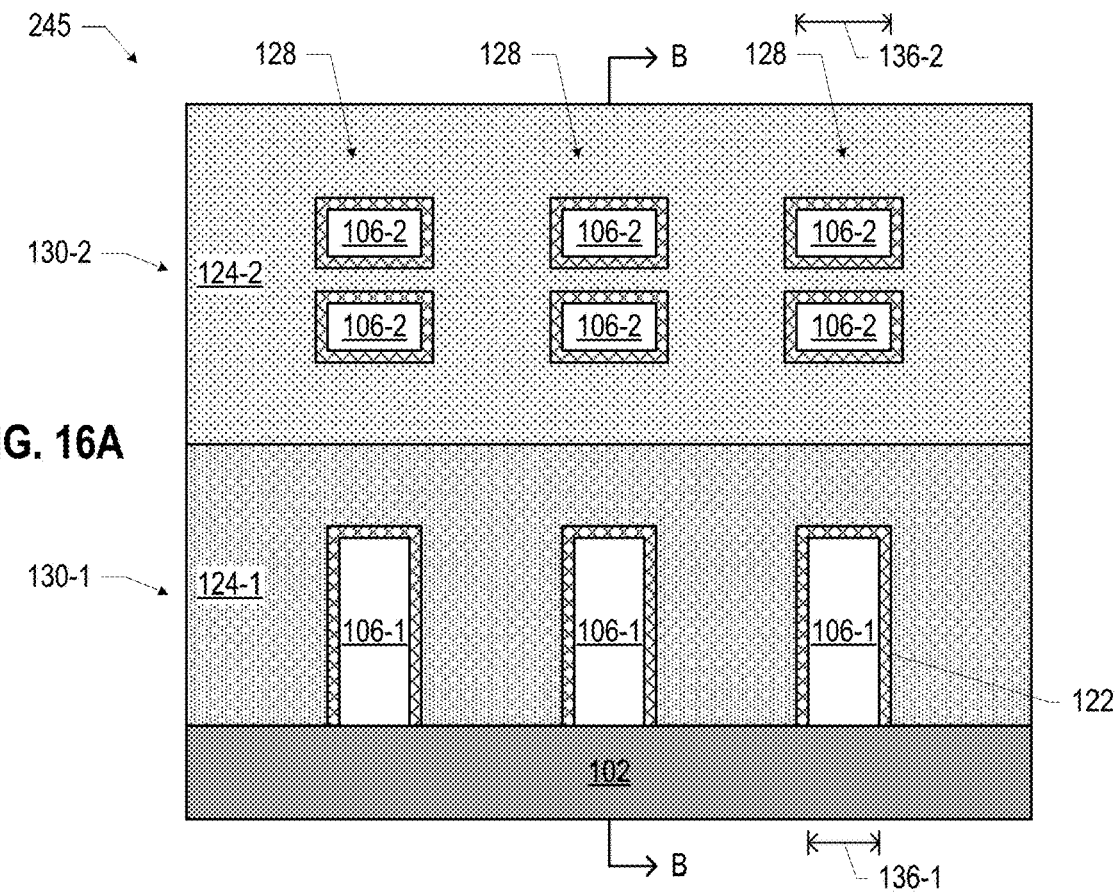
Figure 16B:
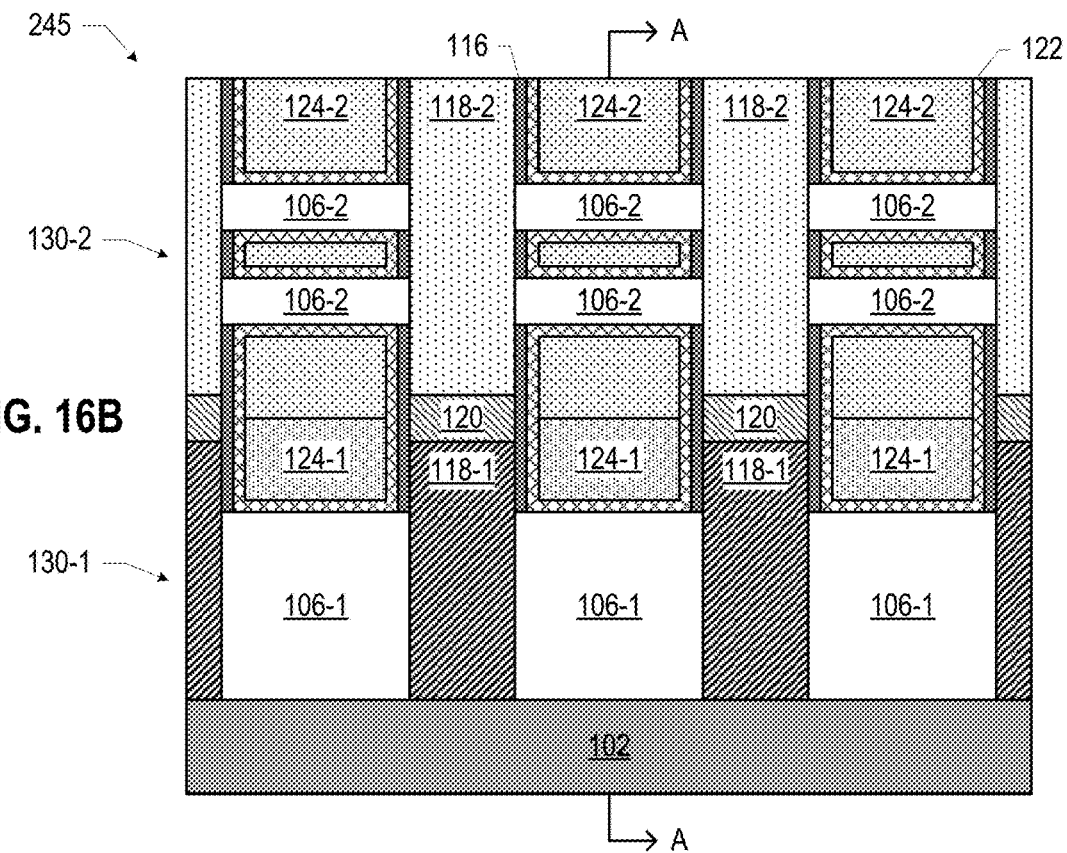

FIG. 16 illustrates an assembly 245 subsequent to forming gate metal 124-1 around the gate dielectric 122 in the device strata 130-1 of the assembly 241 (FIG. 15), and then forming gate metal 124-2 around the gate dielectric 122 in the device strata 130-2. In embodiments in which the gate metal 124-1 has a same material composition as the gate metal 124-2, the formation of the gate metal 124 be performed in a single operation. The assembly 245 may take the form of the IC structure 100 of FIG. 1. Subsequent manufacturing operations, including the formation of conductive contacts to the gate metal 124 and the S/D material 118, may then be performed.

Figure 18A:
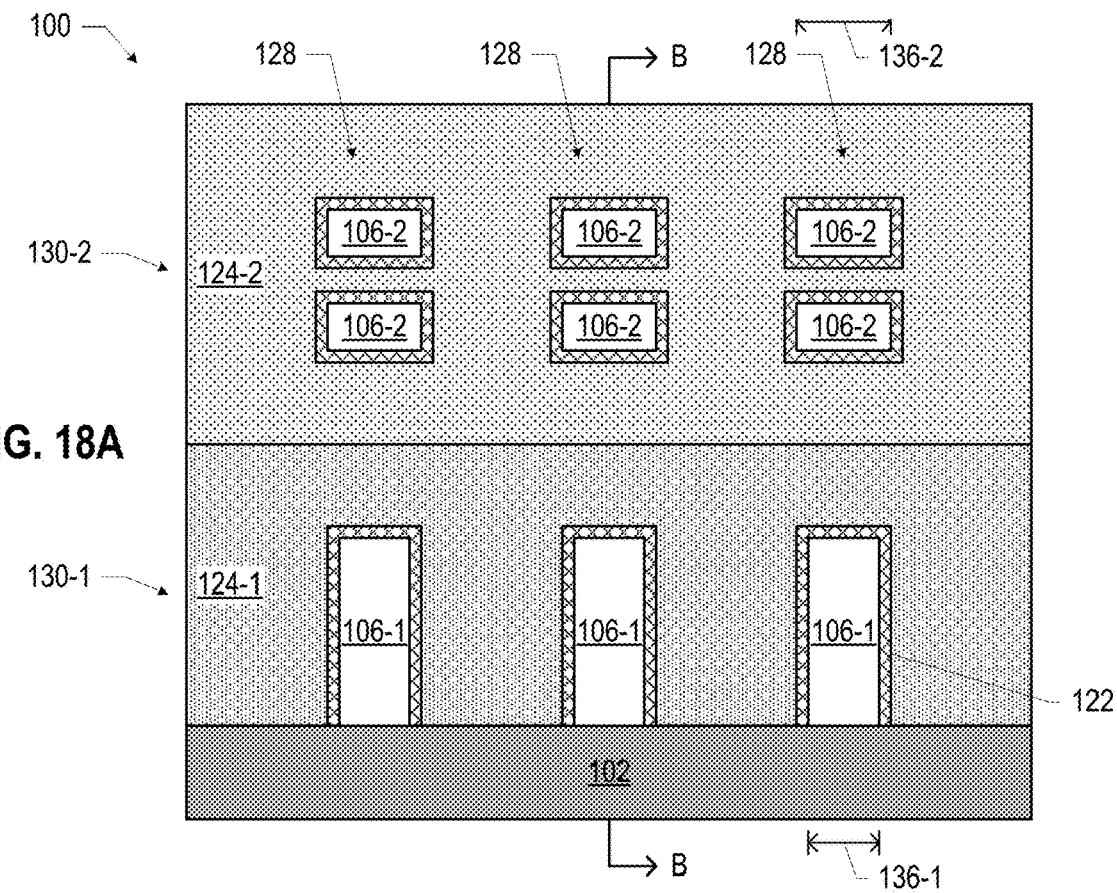
Figure 18B:
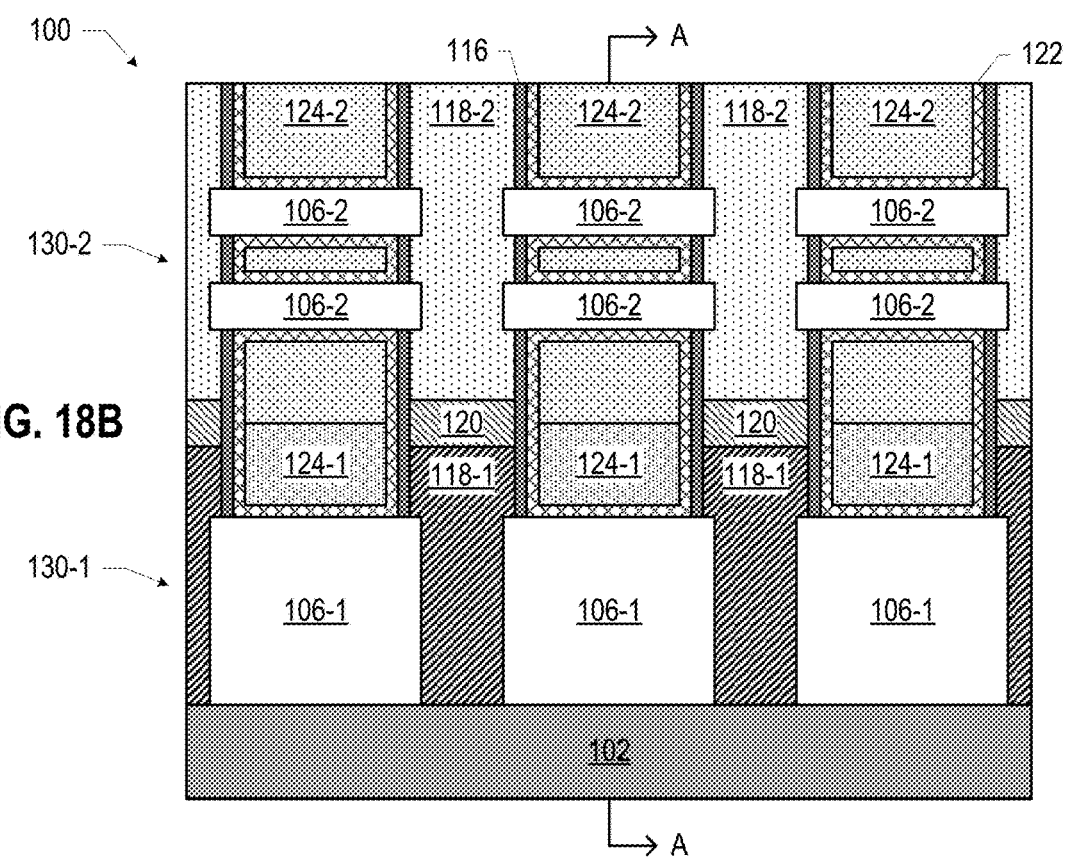

FIGS. 17-21 illustrate additional example IC structures 100. Any of the features discussed with reference to any of FIGS. 1 and 17-21 herein may be combined with any other features to form an IC structure 100. For example, as discussed further below, FIG. 17 illustrates an embodiment in which the S/D material 118 of different device strata 130 are not isolated from each other and FIG. 18 illustrates an embodiment in which the channel material 106 extends into the S/D material 118. These features of FIGS. 17 and 18 may be combined so that the S/D material 118 of different device strata 130 in an IC structure 100 are not isolated from each other, and the channel material 106 extends into the S/D material 118. This particular combination is simply an example, and any combination may be used. A number of elements of FIG. 1 are shared with FIGS. 17-21; for ease of discussion, a description of these elements is not repeated, and these elements may take the form of any of the embodiments disclosed herein.

FIG. 17 illustrates an IC structure 100 in which the insulating material 120 is present between some portions of the S/D material 118-1 and the S/D material 118-2, while other portions of the S/D material 118-1 and the S/D material 118-2 are in physical contact (and thus electrical contact). The selective use of insulating material 120 may allow desired circuit connections to be made between the S/D material 118-1 and the S/D material 118-2; for example, when the transistors of the device strata 130-1 in the dashed box are PMOS transistors, and the transistors of the device strata 130-2 in the dashed box are NMOS transistors (or vice versa), the circuit in the dashed box may be an inverter.

FIG. 18 illustrates an IC structure 100 in which the channel material 106 is not "trimmed" to be flush with the outer surface of the spacers 116 (as discussed above with reference to FIG. 7), but instead extends into the S/D material 118.

Figure 19A:
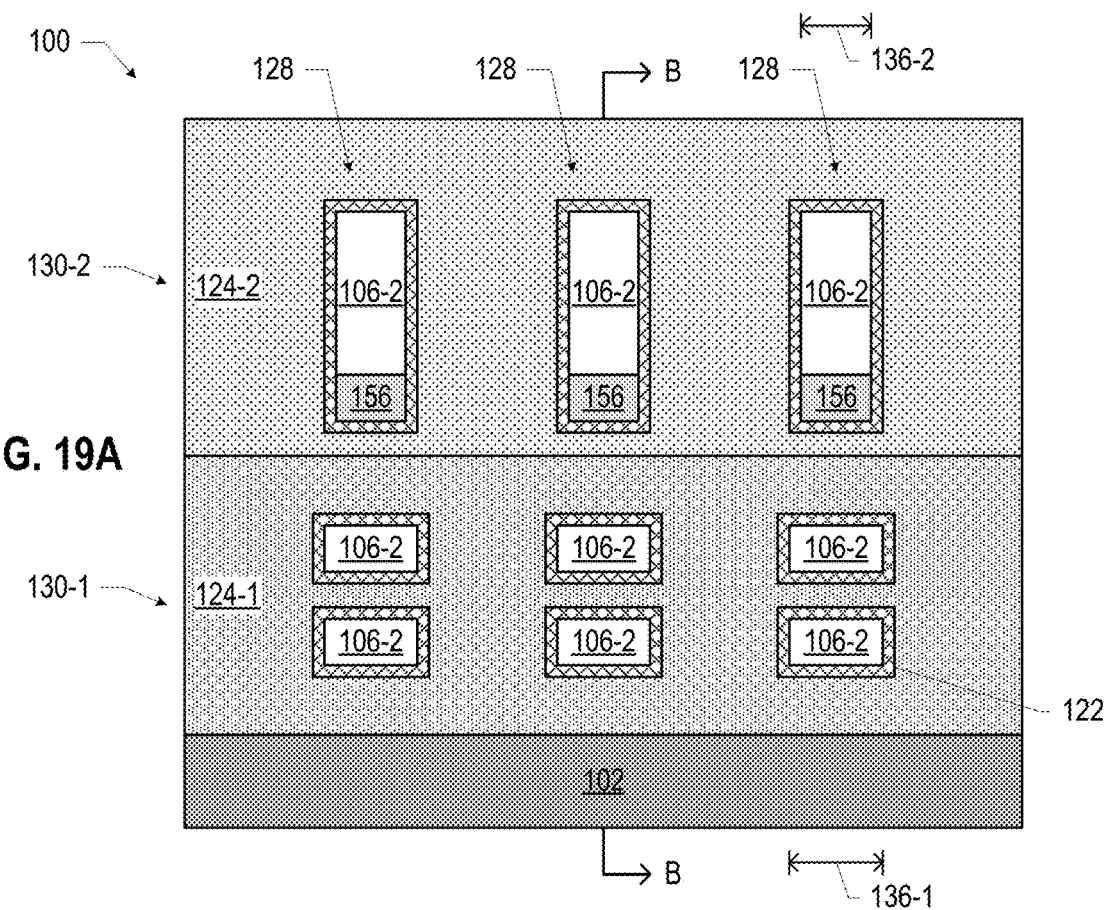
Figure 19B:
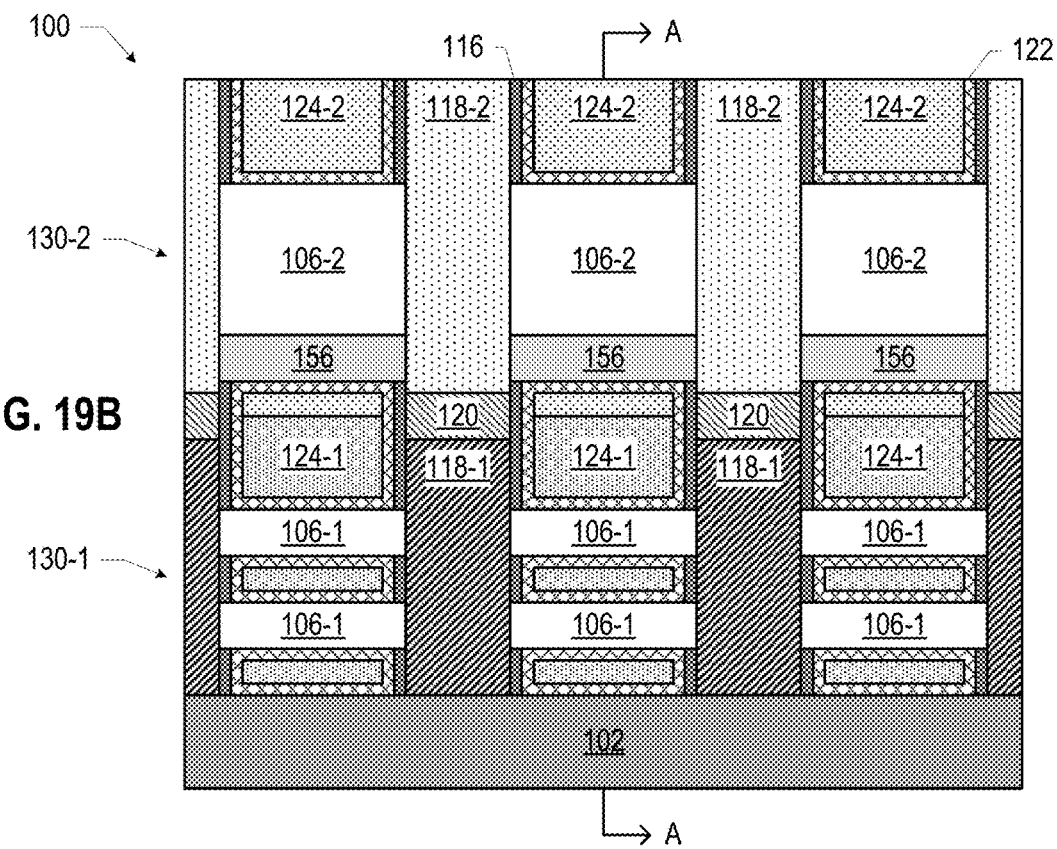
Figure 20A:
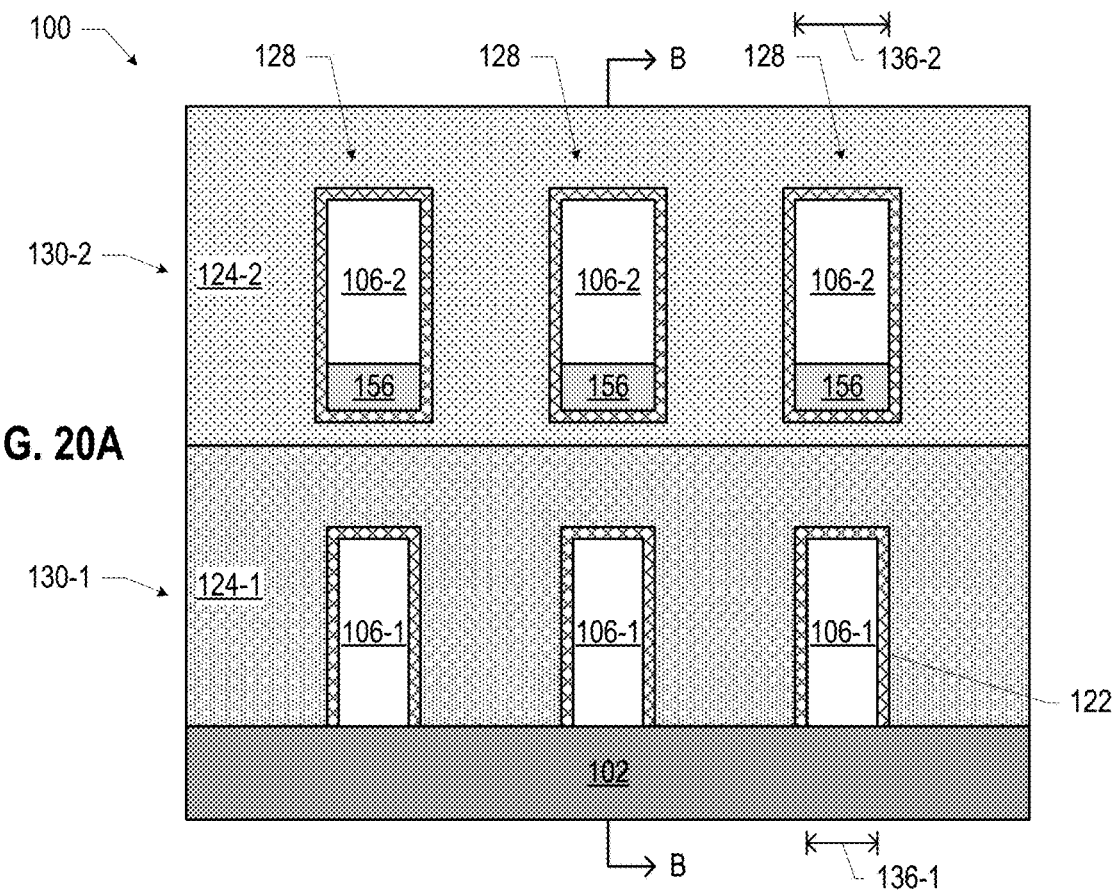
Figure 20B:
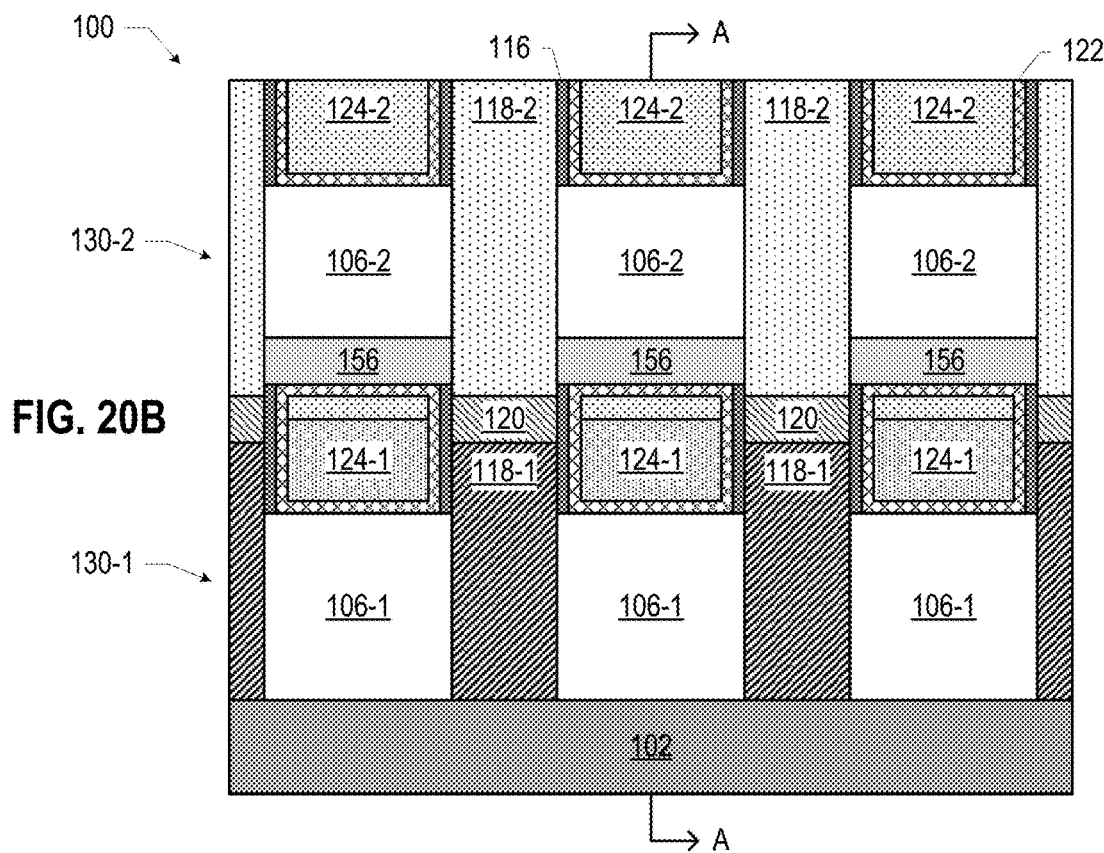

As noted above, the channel material 106 in different device strata 130 may include one or more wires and/or one or more fins. FIG. 19 illustrates an IC structure 100 in which the channel material 106-1 in the device stratum 130-1 includes multiple wires (each surrounded by the gate dielectric 122 and the gate metal 124-1), while the channel material 106-2 in the device stratum 130-2 is a fin in contact with a portion of insulating material 156 (and thus the gate dielectric 122 nor the gate metal 124-2 contact the channel material 106-2 entirely around the channel material 106-2). The width 136-2 of the channel material 106-2 is smaller than the width 136-1 of the channel material 106-1 in the IC structure 100 of FIG. 19. FIG. 20 illustrates an IC structure 100 in which the channel material 106-1 in the device stratum 130-1 is a fin in contact with the base 102, and the channel material 106-2 in the device stratum 130-2 is a fin in contact with a portion of insulating material 156 (which may be part of the material stack of the assembly 200 and patterned along with the channel material 106-2). In the IC structure 100 of FIG. 20, neither the gate dielectric 122 nor the gate metal 124-2 contact the channel material 106-2 entirely around the channel material 106-2. In some variants of the embodiment of FIGS. 19 and 20, no gate dielectric 122 may be present on the insulating material 156; such an IC structure 100 may be manufactured by selecting a gate dielectric 122 and a deposition technique that allows the gate dielectric 122 to selectively deposit on the channel material 106 without also depositing on the insulating material 156.

FIG. 19 illustrates a particular embodiment in which the width 136-2 of the channel material 106-2 is smaller than the width 136-1 of the channel material 106-1, but the width 136-2 of the channel material 106-2 may be smaller than the width 136-1 of the channel material 106-1 in any of the embodiments disclosed herein. The IC structure 100 of FIG. 19 (and other IC structures 100 in which the width 136-1 is larger than the width 136-2) may be formed by adjusting the material stack of the assembly 200 accordingly, proceeding to the assembly 235 of FIG. 9, depositing a masking material (e.g., a hardmask) around the channel material 106-1 (e.g., by blanket depositing the masking material and then recessing it back), depositing an oxidation catalyst 152 over the exposed channel material 106-2, annealing the assembly to oxidize the channel material 106-2 in contact with the oxidation catalyst, then cleaning the result to remove the oxidation and any remaining oxidation catalyst 152, before proceeding with the remainder of the operations discussed above with reference to FIGS. 15-16. The IC structure 100 of FIG. 20 may be formed by adjusting the material stack of the assembly 200 accordingly, and then proceeding with the remainder of the operations discussed above with reference to FIGS. 3-16.

Figure 21:
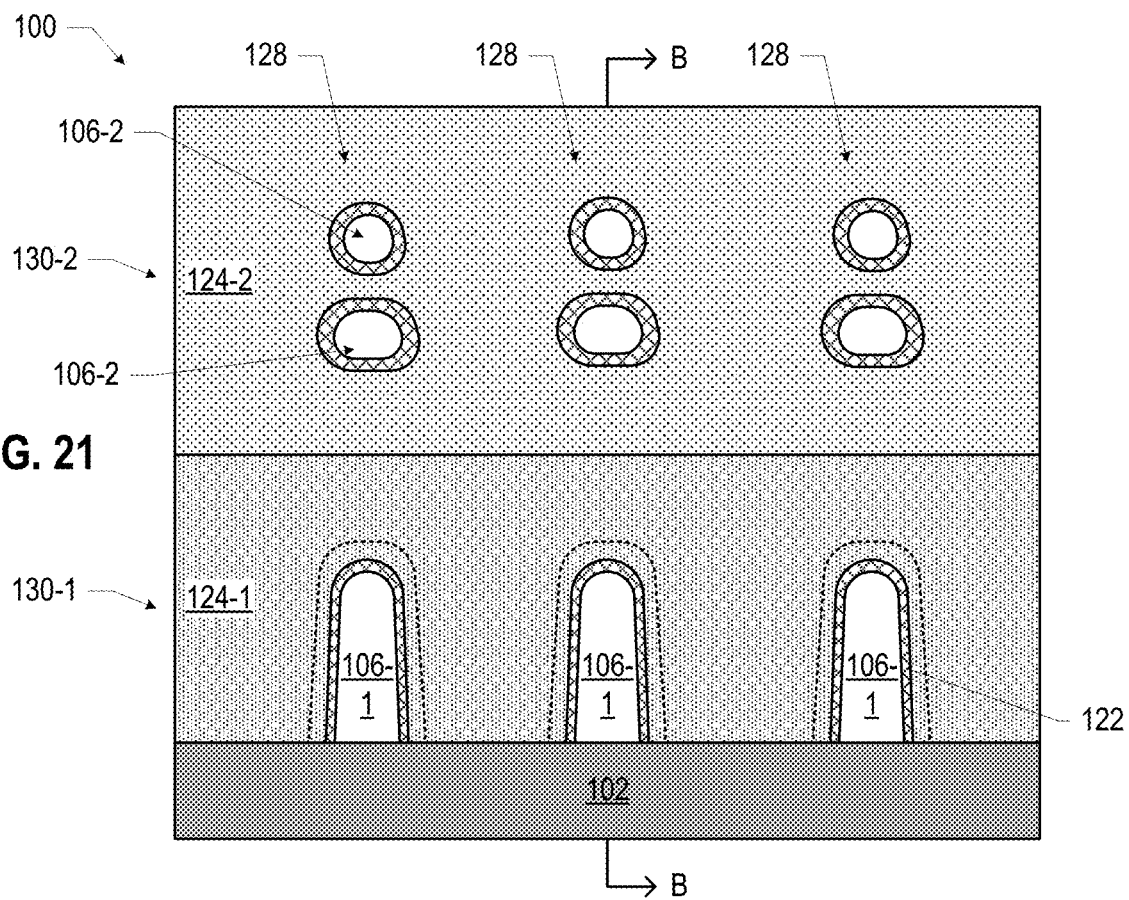

As noted above, the IC structures 100 depicted in various ones of the accompanying drawings are shown as having precise rectilinear features, but this assembly for ease of illustration, and devices manufactured using practical manufacturing processes deviate from rectilinearity. FIG. 21 is a depiction of the IC structure 100 of FIG. 1 (sharing the perspective of FIG. 1A) that includes some of the rounding and tapering that is likely to occur when the IC structure 100 is practically manufactured. The IC structure 100 of FIG. 21 includes some tapering of the channel materials 106, with the channel materials 106 widening closer to the base 102 (as discussed above with reference to FIG. 3), as well as rounding of the channel materials 106 themselves. Other non-idealities may also be present in a manufactured IC structure 100.

The IC structures 100 disclosed herein may be included in any suitable electronic component. FIGS. 22-26 illustrate various examples of apparatuses that may include any of the IC structures 100 disclosed herein.

Figure 22:
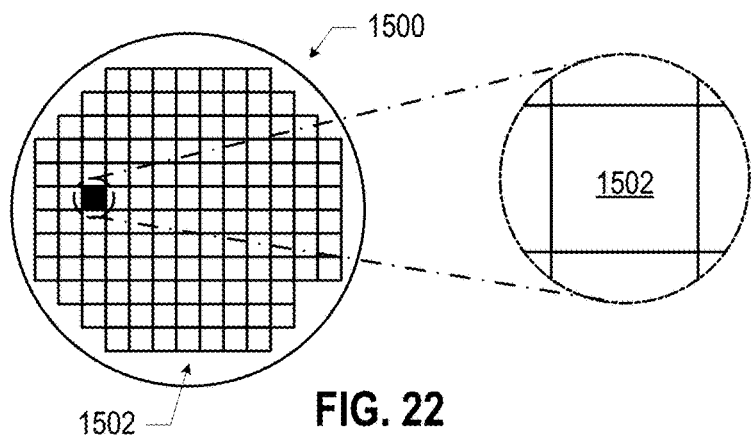
FIG. 22 is a top view of a wafer and dies that may include any of the IC structures disclosed herein, in accordance with any of the embodiments disclosed herein.

FIG. 22 is a top view of a wafer 1500 and dies 1502 that may include one or more IC structures 100 in accordance with any of the embodiments disclosed herein. The wafer 1500 may be composed of semiconductor material and may include one or more dies 1502 having IC structures formed on a surface of the wafer 1500. Each of the dies 1502 may be a repeating unit of a semiconductor product that includes any suitable IC. After the fabrication of the semiconductor product is complete, the wafer 1500 may undergo a singulation process in which the dies 1502 are separated from one another to provide discrete "chips" of the semiconductor product. The die 1502 may include one or more IC structures 100 (e.g., as discussed below with reference to FIG. 23), one or more transistors (e.g., some of the transistors of the device region 1604 of FIG. 23, discussed below) and/or supporting circuitry to route electrical signals to the transistors, as well as any other IC components. In some embodiments, the wafer 1500 or the die 1502 may include a memory device (e.g., a random access memory (RAM) device, such as a static RAM (SRAM) device, a magnetic RAM (MRAM) device, a resistive RAM (RRAM) device, a conductive-bridging RAM (CBRAM) device, etc.), a logic device (e.g., an AND, OR, NAND, or NOR gate), or any other suitable circuit element. Multiple ones of these devices may be combined on a single die 1502. For example, a memory array formed by multiple memory devices may be formed on a same die 1502 as a processing device (e.g., the processing device 1802 of FIG. 26) or other logic that is configured to store information in the memory devices or execute instructions stored in the memory array.

Figure 23:
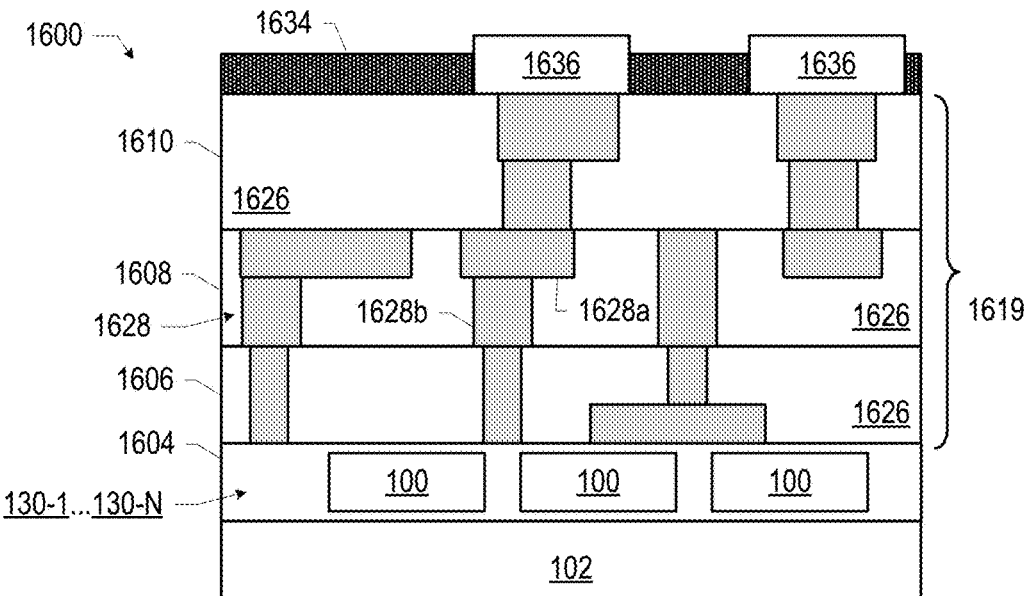
FIG. 23 is a side, cross-sectional view of an IC device that may include any of the IC structures disclosed herein, in accordance with any of the embodiments disclosed herein.

FIG. 23 is a side, cross-sectional view of an IC device 1600 that may include one or more IC structures 100 in accordance with any of the embodiments disclosed herein. One or more of the IC devices 1600 may be included in one or more dies 1502 (FIG. 22). The IC device 1600 may include a base 102, which may include some of the wafer 1500 of FIG. 22 and may be included in a die (e.g., the die 1502 of FIG. 22). The base 102 may take any of the forms disclosed herein.

The IC device 1600 may include a device region 1604 including multiple device strata 130 on the base 102. The device region 1604 may include any of the multi-strata IC structures 100 disclosed herein. Further, the device region 1604 may include regions having only a single device stratum 130, or regions having different numbers of device strata 130. For example, one or more regions of the device region 1604 may include the multi-strata IC structures 100 disclosed herein, and other regions of the device region 1604 may include a single device strata 130 including planar transistors (e.g., bipolar junction transistors (BJT), heterojunction bipolar transistors (HBT), or high-electron-mobility transistors (HEMT)) or non-planar transistors (e.g., double-gate transistors, tri-gate transistors, or wrap-around or all-around gate transistors such as nanoribbon and nanowire transistors). The device region 1604 may further include electrical contacts to the gates of the transistors included in the device region 1604 (e.g., to the gate metal 124 of the IC structures 100) and to the S/D materials of the transistors included in the device region 1604 (e.g., to the S/D materials 118 of the IC structures 100).

Electrical signals, such as power and/or input/output (I/O) signals, may be routed to and/or from the devices (e.g., the transistors) of the device region 1604 through one or more interconnect layers disposed on the device region 1604 (illustrated in FIG. 23 as interconnect layers 1606-1610). For example, electrically conductive features of the device region 1604 (e.g., the gate metal 124 and the S/D materials 118) may be electrically coupled with the interconnect structures 1628 of the interconnect layers 1606-1610. The one or more interconnect layers 1606-1610 may form a metallization stack (also referred to as an "ILD stack") 1619 of the IC device 1600.

The interconnect structures 1628 may be arranged within the interconnect layers 1606-1610 to route electrical signals according to a wide variety of designs (in particular, the arrangement is not limited to the particular configuration of interconnect structures 1628 depicted in FIG. 23). Although a particular number of interconnect layers 1606-1610 is depicted in FIG. 23, embodiments of the present disclosure include IC devices having more or fewer interconnect layers than depicted.

In some embodiments, the interconnect structures 1628 may include lines 1628a and/or vias 1628b filled with an electrically conductive material such as a metal. The lines 1628a may be arranged to route electrical signals in a direction of a plane that is substantially parallel with a surface of the base 102 upon which the device region 1604 is formed. For example, the lines 1628a may route electrical signals in a direction in and out of the page from the perspective of FIG. 23. The vias 1628b may be arranged to route electrical signals in a direction of a plane that is substantially perpendicular to the surface of the base 102 upon which the device region 1604 is formed. In some embodiments, the vias 1628b may electrically couple lines 1628a of different interconnect layers 1606-1610 together.

The interconnect layers 1606-1610 may include a dielectric material 1626 disposed between the interconnect structures 1628, as shown in FIG. 23. In some embodiments, the dielectric material 1626 disposed between the interconnect structures 1628 in different ones of the interconnect layers 1606-1610 may have different compositions; in other embodiments, the composition of the dielectric material 1626 between different interconnect layers 1606-1610 may be the same.

A first interconnect layer 1606 may be formed above the device region 1604. In some embodiments, the first interconnect layer 1606 may include lines 1628a and/or vias 1628b, as shown. The lines 1628a of the first interconnect layer 1606 may be coupled with contacts (e.g., contacts to the S/D materials 118 of the IC structures 100) of the device region 1604.

A second interconnect layer 1608 may be formed above the first interconnect layer 1606. In some embodiments, the second interconnect layer 1608 may include vias 1628b to couple the lines 1628a of the second interconnect layer 1608 with the lines 1628a of the first interconnect layer 1606. Although the lines 1628a and the vias 1628b are structurally delineated with a line within each interconnect layer (e.g., within the second interconnect layer 1608) for the sake of clarity, the lines 1628a and the vias 1628b may be structurally and/or materially contiguous (e.g., simultaneously filled during a dual-damascene process) in some embodiments.

A third interconnect layer 1610 (and additional interconnect layers, as desired) may be formed in succession on the second interconnect layer 1608 according to similar techniques and configurations described in connection with the second interconnect layer 1608 or the first interconnect layer 1606. In some embodiments, the interconnect layers that are "higher up" in the metallization stack 1619 in the IC device 1600 (i.e., farther away from the device region 1604) may be thicker.

The IC device 1600 may include a solder resist material 1634 (e.g., polyimide or similar material) and one or more conductive contacts 1636 formed on the interconnect layers 1606-1610. In FIG. 23, the conductive contacts 1636 are illustrated as taking the form of bond pads. The conductive contacts 1636 may be electrically coupled with the interconnect structures 1628 and configured to route the electrical signals of the transistor(s) of the device region 1604 to other external devices. For example, solder bonds may be formed on the one or more conductive contacts 1636 to mechanically and/or electrically couple a chip including the IC device 1600 with another component (e.g., a circuit board). The IC device 1600 may include additional or alternate structures to route the electrical signals from the interconnect layers 1606-1610; for example, the conductive contacts 1636 may include other analogous features (e.g., posts) that route the electrical signals to external components.

Figure 24:
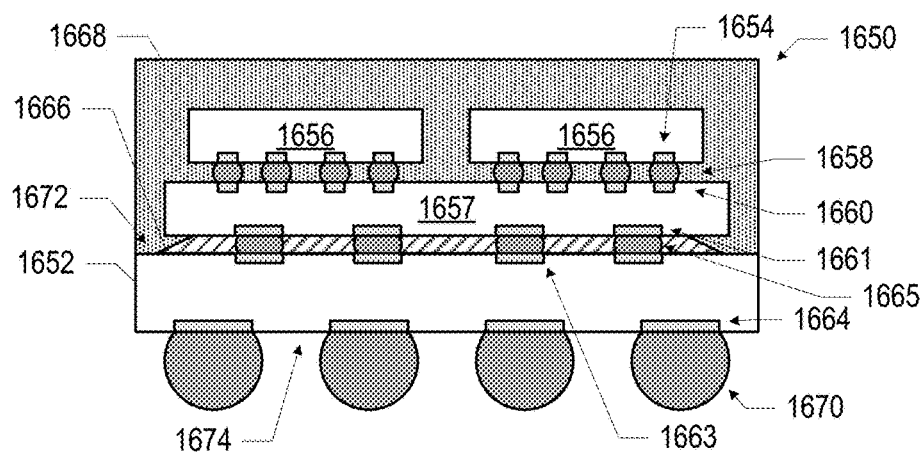
FIG. 24 is a side, cross-sectional view of an IC package that may include any of the IC structures disclosed herein, in accordance with various embodiments.

FIG. 24 is a side, cross-sectional view of an example IC package 1650 that may include one or more IC structures 100 in accordance with any of the embodiments disclosed herein. In some embodiments, the IC package 1650 may be a system-in-package (SiP).

The package substrate 1652 may be formed of a dielectric material (e.g., a ceramic, a buildup film, an epoxy film having filler particles therein, glass, an organic material, an inorganic material, combinations of organic and inorganic materials, embedded portions formed of different materials, etc.), and may have conductive pathways extending through the dielectric material between the face 1672 and the face 1674, or between different locations on the face 1672, and/or between different locations on the face 1674. These conductive pathways may take the form of any of the interconnects 1628 discussed above with reference to FIG. 23.

The package substrate 1652 may include conductive contacts 1663 that are coupled to conductive pathways (not shown) through the package substrate 1652, allowing circuitry within the dies 1656 and/or the interposer 1657 to electrically couple to various ones of the conductive contacts 1664 (or to devices included in the package substrate 1652, not shown).

The IC package 1650 may include an interposer 1657 coupled to the package substrate 1652 via conductive contacts 1661 of the interposer 1657, first-level interconnects 1665, and the conductive contacts 1663 of the package substrate 1652. The first-level interconnects 1665 illustrated in FIG. 24 are solder bumps, but any suitable first-level interconnects 1665 may be used. In some embodiments, no interposer 1657 may be included in the IC package 1650; instead, the dies 1656 may be coupled directly to the conductive contacts 1663 at the face 1672 by first-level interconnects 1665. More generally, one or more dies 1656 may be coupled to the package substrate 1652 via any suitable structure (e.g., a silicon bridge, an organic bridge, one or more waveguides, one or more interposers, wirebonds, etc.).

The IC package 1650 may include one or more dies 1656 coupled to the interposer 1657 via conductive contacts 1654 of the dies 1656, first-level interconnects 1658, and conductive contacts 1660 of the interposer 1657. The conductive contacts 1660 may be coupled to conductive pathways (not shown) through the interposer 1657, allowing circuitry within the dies 1656 to electrically couple to various ones of the conductive contacts 1661 (or to other devices included in the interposer 1657, not shown). The first-level interconnects 1658 illustrated in FIG. 24 are solder bumps, but any suitable first-level interconnects 1658 may be used. As used herein, a "conductive contact" may refer to a portion of conductive material (e.g., metal) serving as an interface between different components; conductive contacts may be recessed in, flush with, or extending away from a surface of a component, and may take any suitable form (e.g., a conductive pad or socket).

In some embodiments, an underfill material 1666 may be disposed between the package substrate 1652 and the interposer 1657 around the first-level interconnects 1665, and a mold compound 1668 may be disposed around the dies 1656 and the interposer 1657 and in contact with the package substrate 1652. In some embodiments, the underfill material 1666 may be the same as the mold compound 1668. Example materials that may be used for the underfill material 1666 and the mold compound 1668 are epoxy mold materials, as suitable. Second-level interconnects 1670 may be coupled to the conductive contacts 1664. The second-level interconnects 1670 illustrated in FIG. 24 are solder balls (e.g., for a ball grid array arrangement), but any suitable second-level interconnects 1670 may be used (e.g., pins in a pin grid array arrangement or lands in a land grid array arrangement). The second-level interconnects 1670 may be used to couple the IC package 1650 to another component, such as a circuit board (e.g., a motherboard), an interposer, or another IC package, as known in the art and as discussed below with reference to FIG. 25.

The dies 1656 may take the form of any of the embodiments of the die 1502 discussed herein (e.g., may include any of the embodiments of the IC device 1600). In embodiments in which the IC package 1650 includes multiple dies 1656, the IC package 1650 may be referred to as a multi-chip package (MCP). The dies 1656 may include circuitry to perform any desired functionality. For example, or more of the dies 1656 may be logic dies (e.g., silicon-based dies), and one or more of the dies 1656 may be memory dies (e.g., high bandwidth memory).

Although the IC package 1650 illustrated in FIG. 24 is a flip chip package, other package architectures may be used. For example, the IC package 1650 may be a ball grid array (BGA) package, such as an embedded wafer-level ball grid array (eWLB) package. In another example, the IC package 1650 may be a wafer-level chip scale package (WLCSP) or a panel fanout (FO) package. Although two dies 1656 are illustrated in the IC package 1650 of FIG. 24, an IC package 1650 may include any desired number of dies 1656. An IC package 1650 may include additional passive components, such as surface-mount resistors, capacitors, and inductors disposed on the first face 1672 or the second face 1674 of the package substrate 1652, or on either face of the interposer 1657. More generally, an IC package 1650 may include any other active or passive components known in the art.

Figure 25:
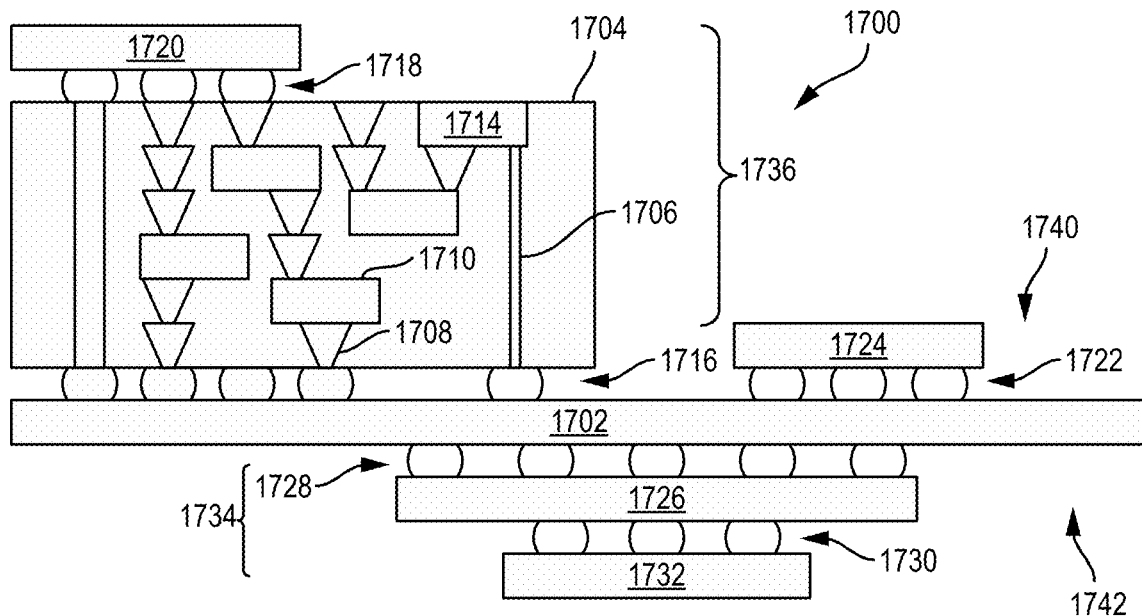
FIG. 25 is a side, cross-sectional view of an IC device assembly that may include any of the IC structures disclosed herein, in accordance with any of the embodiments disclosed herein.

FIG. 25 is a side, cross-sectional view of an IC device assembly 1700 that may include one or more IC packages or other electronic components (e.g., a die) including one or more IC structures 100 in accordance with any of the embodiments disclosed herein. The IC device assembly 1700 includes a number of components disposed on a circuit board 1702 (which may be, e.g., a motherboard). The IC device assembly 1700 includes components disposed on a first face 1740 of the circuit board 1702 and an opposing second face 1742 of the circuit board 1702; generally, components may be disposed on one or both faces 1740 and 1742. Any of the IC packages discussed below with reference to the IC device assembly 1700 may take the form of any of the embodiments of the IC package 1650 discussed above with reference to FIG. 24 (e.g., may include one or more IC structures 100 in a die).

In some embodiments, the circuit board 1702 may be a printed circuit board (PCB) including multiple metal layers separated from one another by layers of dielectric material and interconnected by electrically conductive vias. Any one or more of the metal layers may be formed in a desired circuit pattern to route electrical signals (optionally in conjunction with other metal layers) between the components coupled to the circuit board 1702. In other embodiments, the circuit board 1702 may be a non-PCB substrate.

The IC device assembly 1700 illustrated in FIG. 25 includes a package-on-interposer structure 1736 coupled to the first face 1740 of the circuit board 1702 by coupling components 1716. The coupling components 1716 may electrically and mechanically couple the package-on-interposer structure 1736 to the circuit board 1702, and may include solder balls (as shown in FIG. 25), male and female portions of a socket, an adhesive, an underfill material, and/or any other suitable electrical and/or mechanical coupling structure.

The package-on-interposer structure 1736 may include an IC package 1720 coupled to an package interposer 1704 by coupling components 1718. The coupling components 1718 may take any suitable form for the application, such as the forms discussed above with reference to the coupling components 1716. Although a single IC package 1720 is shown in FIG. 25, multiple IC packages may be coupled to the package interposer 1704; indeed, additional interposers may be coupled to the package interposer 1704. The package interposer 1704 may provide an intervening substrate used to bridge the circuit board 1702 and the IC package 1720. The IC package 1720 may be or include, for example, a die (the die 1502 of FIG. 22), an IC device (e.g., the IC device 1600 of FIG. 23), or any other suitable component. Generally, the package interposer 1704 may spread a connection to a wider pitch or reroute a connection to a different connection. For example, the package interposer 1704 may couple the IC package 1720 (e.g., a die) to a set of BGA conductive contacts of the coupling components 1716 for coupling to the circuit board 1702. In the embodiment illustrated in FIG. 25, the IC package 1720 and the circuit board 1702 are attached to opposing sides of the package interposer 1704; in other embodiments, the IC package 1720 and the circuit board 1702 may be attached to a same side of the package interposer 1704. In some embodiments, three or more components may be interconnected by way of the package interposer 1704.

In some embodiments, the package interposer 1704 may be formed as a PCB, including multiple metal layers separated from one another by layers of dielectric material and interconnected by electrically conductive vias. In some embodiments, the package interposer 1704 may be formed of an epoxy resin, a fiberglass-reinforced epoxy resin, an epoxy resin with inorganic fillers, a ceramic material, or a polymer material such as polyimide. In some embodiments, the package interposer 1704 may be formed of alternate rigid or flexible materials that may include the same materials described above for use in a semiconductor substrate, such as silicon, germanium, and other group III-V and group IV materials. The package interposer 1704 may include metal lines 1710 and vias 1708, including but not limited to through-silicon vias (TSVs) 1706. The package interposer 1704 may further include embedded devices 1714, including both passive and active devices. Such devices may include, but are not limited to, capacitors, decoupling capacitors, resistors, inductors, fuses, diodes, transformers, sensors, electrostatic discharge (ESD) devices, and memory devices. More complex devices such as radio frequency devices, power amplifiers, power management devices, antennas, arrays, sensors, and microelectromechanical systems (MEMS) devices may also be formed on the package interposer 1704. The package-on-interposer structure 1736 may take the form of any of the package-on-interposer structures known in the art.

The IC device assembly 1700 may include an IC package 1724 coupled to the first face 1740 of the circuit board 1702 by coupling components 1722. The coupling components 1722 may take the form of any of the embodiments discussed above with reference to the coupling components 1716, and the IC package 1724 may take the form of any of the embodiments discussed above with reference to the IC package 1720.

The IC device assembly 1700 illustrated in FIG. 25 includes a package-on-package structure 1734 coupled to the second face 1742 of the circuit board 1702 by coupling components 1728. The package-on-package structure 1734 may include an IC package 1726 and an IC package 1732 coupled together by coupling components 1730 such that the IC package 1726 is disposed between the circuit board 1702 and the IC package 1732. The coupling components 1728 and 1730 may take the form of any of the embodiments of the coupling components 1716 discussed above, and the IC packages 1726 and 1732 may take the form of any of the embodiments of the IC package 1720 discussed above. The package-on-package structure 1734 may be configured in accordance with any of the package-on-package structures known in the art.

Figure 26:
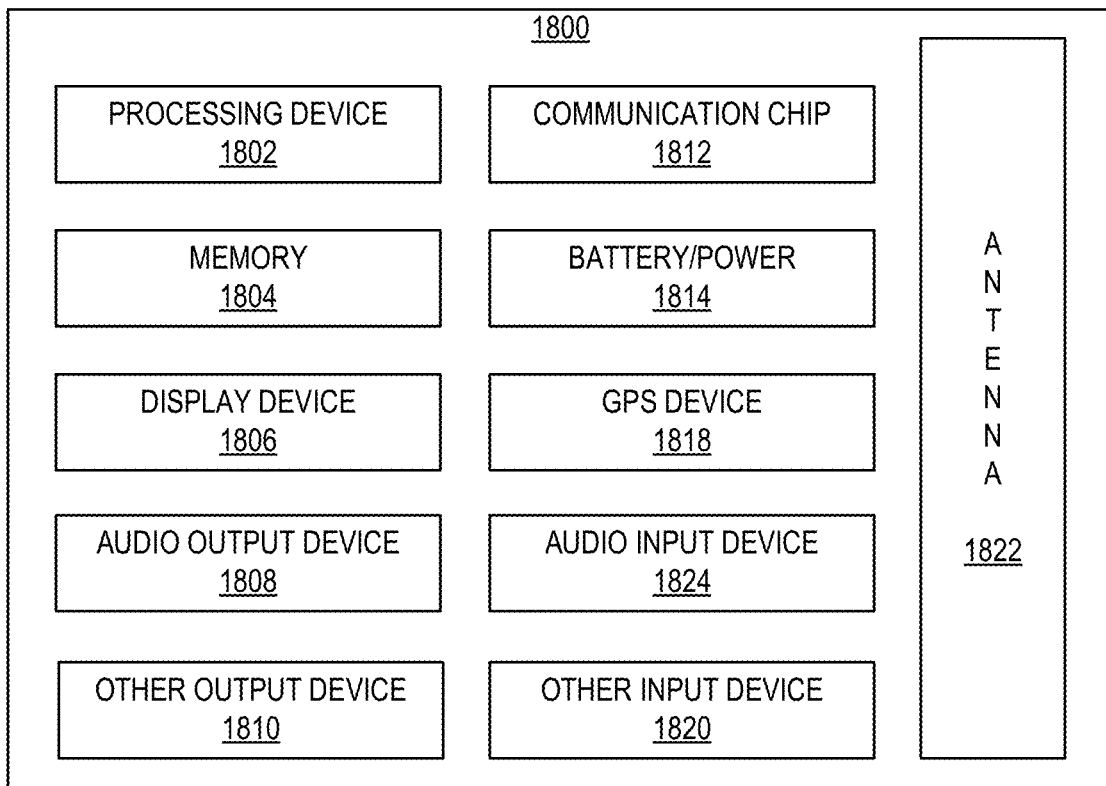
FIG. 26 is a block diagram of an example electrical device that may include any of the IC structures disclosed herein, in accordance with any of the embodiments disclosed herein.

FIG. 26 is a block diagram of an example electrical device 1800 that may include one or more IC structures 100 in accordance with any of the embodiments disclosed herein. For example, any suitable ones of the components of the electrical device 1800 may include one or more of the IC device assemblies 1700, IC packages 1650, IC devices 1600, or dies 1502 disclosed herein. A number of components are illustrated in FIG. 26 as included in the electrical device 1800, but any one or more of these components may be omitted or duplicated, as suitable for the application. In some embodiments, some or all of the components included in the electrical device 1800 may be attached to one or more motherboards. In some embodiments, some or all of these components are fabricated onto a single system-on-a-chip (SoC) die.

Additionally, in various embodiments, the electrical device 1800 may not include one or more of the components illustrated in FIG. 26, but the electrical device 1800 may include interface circuitry for coupling to the one or more components. For example, the electrical device 1800 may not include a display device 1806, but may include display device interface circuitry (e.g., a connector and driver circuitry) to which a display device 1806 may be coupled. In another set of examples, the electrical device 1800 may not include an audio input device 1824 or an audio output device 1808, but may include audio input or output device interface circuitry (e.g., connectors and supporting circuitry) to which an audio input device 1824 or audio output device 1808 may be coupled.

The electrical device 1800 may include a processing device 1802 (e.g., one or more processing devices). As used herein, the term "processing device" or "processor" may refer to any device or portion of a device that processes electronic data from registers and/or memory to transform that electronic data into other electronic data that may be stored in registers and/or memory. The processing device 1802 may include one or more digital signal processors (DSPs), application-specific integrated circuits (ASICs), central processing units (CPUs), graphics processing units (GPUs), cryptoprocessors (specialized processors that execute cryptographic algorithms within hardware), server processors, or any other suitable processing devices. The electrical device 1800 may include a memory 1804, which may itself include one or more memory devices such as volatile memory (e.g., dynamic random access memory (DRAM)), nonvolatile memory (e.g., read-only memory (ROM)), flash memory, solid state memory, and/or a hard drive. In some embodiments, the memory 1804 may include memory that shares a die with the processing device 1802. This memory may be used as cache memory and may include embedded dynamic random access memory (eDRAM) or spin transfer torque magnetic random access memory (STT-MRAM).

In some embodiments, the electrical device 1800 may include a communication chip 1812 (e.g., one or more communication chips). For example, the communication chip 1812 may be configured for managing wireless communications for the transfer of data to and from the electrical device 1800. The term "wireless" and its derivatives may be used to describe circuits, devices, systems, methods, techniques, communications channels, etc., that may communicate data through the use of modulated electromagnetic radiation through a nonsolid medium. The term does not imply that the associated devices do not contain any wires, although in some embodiments they might not.

The communication chip 1812 may implement any of a number of wireless standards or protocols, including but not limited to Institute for Electrical and Electronic Engineers (IEEE) standards including Wi-Fi (IEEE 802.11 family), IEEE 802.16 standards (e.g., IEEE 802.16-2005 Amendment), Long-Term Evolution (LTE) project along with any amendments, updates, and/or revisions (e.g., advanced LTE project, ultra mobile broadband (UMB) project (also referred to as "3GPP2"), etc.). IEEE 802.16 compatible Broadband Wireless Access (BWA) networks are generally referred to as WiMAX networks, an acronym that stands for Worldwide Interoperability for Microwave Access, which is a certification mark for products that pass conformity and interoperability tests for the IEEE 802.16 standards. The communication chip 1812 may operate in accordance with a Global System for Mobile Communication (GSM), General Packet Radio Service (GPRS), Universal Mobile Telecommunications System (UMTS), High Speed Packet Access (HSPA), Evolved HSPA (E-HSPA), or LTE network. The communication chip 1812 may operate in accordance with Enhanced Data for GSM Evolution (EDGE), GSM EDGE Radio Access Network (GERAN), Universal Terrestrial Radio Access Network (UTRAN), or Evolved UTRAN (E-UTRAN). The communication chip 1812 may operate in accordance with Code Division Multiple Access (CDMA), Time Division Multiple Access (TDMA), Digital Enhanced Cordless Telecommunications (DECT), Evolution-Data Optimized (EV-DO), and derivatives thereof, as well as any other wireless protocols that are designated as 3G, 4G, 5G, and beyond. The communication chip 1812 may operate in accordance with other wireless protocols in other embodiments. The electrical device 1800 may include an antenna 1822 to facilitate wireless communications and/or to receive other wireless communications (such as AM or FM radio transmissions).

In some embodiments, the communication chip 1812 may manage wired communications, such as electrical, optical, or any other suitable communication protocols (e.g., the Ethernet). As noted above, the communication chip 1812 may include multiple communication chips. For instance, a first communication chip 1812 may be dedicated to shorter-range wireless communications such as Wi-Fi or Bluetooth, and a second communication chip 1812 may be dedicated to longer-range wireless communications such as global positioning system (GPS), EDGE, GPRS, CDMA, WiMAX, LTE, EV-DO, or others. In some embodiments, a first communication chip 1812 may be dedicated to wireless communications, and a second communication chip 1812 may be dedicated to wired communications.

The electrical device 1800 may include battery/power circuitry 1814. The battery/power circuitry 1814 may include one or more energy storage devices (e.g., batteries or capacitors) and/or circuitry for coupling components of the electrical device 1800 to an energy source separate from the electrical device 1800 (e.g., AC line power).

The electrical device 1800 may include a display device 1806 (or corresponding interface circuitry, as discussed above). The display device 1806 may include any visual indicators, such as a heads-up display, a computer monitor, a projector, a touchscreen display, a liquid crystal display (LCD), a light-emitting diode display, or a flat panel display.

The electrical device 1800 may include an audio output device 1808 (or corresponding interface circuitry, as discussed above). The audio output device 1808 may include any device that generates an audible indicator, such as speakers, headsets, or earbuds.

The electrical device 1800 may include an audio input device 1824 (or corresponding interface circuitry, as discussed above). The audio input device 1824 may include any device that generates a signal representative of a sound, such as microphones, microphone arrays, or digital instruments (e.g., instruments having a musical instrument digital interface (MIDI) output).

The electrical device 1800 may include a GPS device 1818 (or corresponding interface circuitry, as discussed above). The GPS device 1818 may be in communication with a satellite-based system and may receive a location of the electrical device 1800, as known in the art.

The electrical device 1800 may include an other output device 1810 (or corresponding interface circuitry, as discussed above). Examples of the other output device 1810 may include an audio codec, a video codec, a printer, a wired or wireless transmitter for providing information to other devices, or an additional storage device.

The electrical device 1800 may include an other input device 1820 (or corresponding interface circuitry, as discussed above). Examples of the other input device 1820 may include an accelerometer, a gyroscope, a compass, an image capture device, a keyboard, a cursor control device such as a mouse, a stylus, a touchpad, a bar code reader, a Quick Response (QR) code reader, any sensor, or a radio frequency identification (RFID) reader.

The electrical device 1800 may have any desired form factor, such as a handheld or mobile electrical device (e.g., a cell phone, a smart phone, a mobile internet device, a music player, a tablet computer, a laptop computer, a netbook computer, an ultrabook computer, a personal digital assistant (PDA), an ultra mobile personal computer, etc.), a desktop electrical device, a server device or other networked computing component, a printer, a scanner, a monitor, a set-top box, an entertainment control unit, a vehicle control unit, a digital camera, a digital video recorder, or a wearable electrical device. In some embodiments, the electrical device 1800 may be any other electronic device that processes data.

The following paragraphs provide various examples of the embodiments disclosed herein.

Example 1 is an integrated circuit (IC) structure, including: a first device stratum including a first channel material; and a second device stratum including a second channel material, wherein the second channel material is above and aligned with the first channel material; wherein a width of the first channel material is different from a width of the second channel material.

Example 2 includes the subject matter of Example 1, and further specifies that the width of the first channel material is less than the width of the second channel material.

Example 3 includes the subject matter of Example 1, and further specifies that the width of the first channel material is greater than the width of the second channel material.

Example 4 includes the subject matter of any of Examples 1-3, and further specifies that the first channel material includes a fin.

Example 5 includes the subject matter of Example 4, and further specifies that the second channel material includes a fin.

Example 6 includes the subject matter of Example 4, and further specifies that the second channel material includes a wire.

Example 7 includes the subject matter of any of Examples 1-3, and further specifies that the second channel material includes a fin.

Example 8 includes the subject matter of Example 7, and further specifies that the first channel material includes a fin.

Example 9 includes the subject matter of Example 7, and further specifies that the first channel material includes a wire.

Example 10 includes the subject matter of any of Examples 1-3, and further specifies that the first channel material includes a plurality of wires.

Example 11 includes the subject matter of Example 10, and further specifies that the second channel material includes a plurality of wires.

Example 12 includes the subject matter of Example 1, and further specifies that the first channel material includes a fin, the second channel material includes a plurality of wires, the first channel material includes silicon or germanium, and the second channel material includes a III-V material.

Example 13 includes the subject matter of Example 12, and further specifies that the width of the first channel material is less than the width of the second channel material.

Example 14 includes the subject matter of Example 1, and further specifies that the first channel material includes a plurality of wires, the second channel material includes a fin, the second channel material includes silicon or germanium, and the first channel material includes a III-V material.

Example 15 includes the subject matter of Example 12, and further specifies that the width of the second channel material is less than the width of the first channel material.

Example 16 includes the subject matter of any of Examples 1-15, and further specifies that the first device stratum includes a first gate metal and the second device stratum includes a second gate metal.

Example 17 includes the subject matter of Example 16, and further specifies that the first gate metal has a same material composition as the second gate metal.

Example 18 includes the subject matter of Example 16, and further specifies that the first gate metal has a different material composition than the second gate metal.

Example 19 includes the subject matter of any of Examples 1-18, and further specifies that the first device stratum includes a first gate dielectric and the second device stratum includes a second gate dielectric.

Example 20 includes the subject matter of Example 19, and further specifies that the first gate dielectric has a same material composition as the second gate dielectric.

Example 21 includes the subject matter of Example 19, and further specifies that the first gate dielectric has a different material composition than the second gate dielectric.

Example 22 includes the subject matter of any of Examples 1-21, and further specifies that the first device stratum includes first source/drain materials at opposing ends of the first channel material, the second device stratum includes a second source/drain materials at opposing ends of the first channel material, and the second source/drain materials are above and aligned with the first source/drain materials.

Example 23 includes the subject matter of Example 22, and further specifies that (1) the first channel material extends into the first source/drain materials or (2) the second channel material extends into the second source/drain materials.

Example 24 includes the subject matter of Example 22, and further specifies that (1) the first channel material does not extend into the first source/drain materials or (2) the second channel material does not extend into the second source/drain materials.

Example 25 includes the subject matter of any of Examples 22-24, and further specifies that at least one of the first source/drain materials is in contact with at least one of the second source/drain materials.

Example 26 includes the subject matter of any of Examples 22-25, and further specifies that at least one of the first source/drain materials is materially continuous with at least one of the second source/drain materials.

Example 27 includes the subject matter of any of Examples 22-26, and further specifies that at least one of the first source/drain materials is spaced apart from at least one of the second source/drain materials by an intervening dielectric material.

Example 28 includes the subject matter of any of Examples 1-27, and further specifies that the first device stratum is between a silicon-on-insulator structure and the second device stratum.

Example 29 is an integrated circuit (IC) die, including: a first device stratum including a first channel material, wherein the first channel material has a first width; and a second device stratum including a second channel material, wherein the second channel material has a second width different from the first width; wherein the first channel material has a different material composition than the second channel material.

Example 30 includes the subject matter of Example 29, and further specifies that the first channel material includes a fin and the second channel material includes a plurality of wires.

Example 31 includes the subject matter of Example 30, and further specifies that the width of the first channel material is less than a width of the second channel material.

Example 32 includes the subject matter of any of Examples 30-31, and further specifies that the first channel material includes silicon or germanium.

Example 33 includes the subject matter of any of Examples 30-32, and further specifies that the second channel material includes a III-V material.

Example 34 includes the subject matter of any of Examples 30-33, and further specifies that the first channel material is a channel of a p-type metal oxide semiconductor (PMOS) transistor.

Example 35 includes the subject matter of any of Examples 30-34, and further specifies that the second channel material is a channel of an n-type metal oxide semiconductor (NMOS) transistor.

Example 36 includes the subject matter of any of Examples 29-35, and further specifies that the first device stratum is between a substrate and the second device stratum.

Example 37 includes the subject matter of any of Examples 29-35, and further specifies that the second device stratum is between a substrate and the first device stratum.

Example 38 includes the subject matter of any of Examples 29-35, and further specifies that the first device stratum is between a silicon-on-insulator structure and the second device stratum.

Example 39 includes the subject matter of any of Examples 29-35, and further specifies that the second device stratum is between a silicon-on-insulator structure and the first device stratum.

Example 40 includes the subject matter of any of Examples 29-39, and further includes: a metallization stack including conductive pathways electrically coupled to the first device stratum and the second device stratum.

Example 41 includes the subject matter of any of Examples 29-40, and further includes: a plurality of conductive contacts at an outer face of the IC die, wherein at least some of the conductive contacts are in electrical contact with the first device stratum or the second device stratum.

Example 42 is a computing device, including: a circuit board; and an integrated circuit (IC) package coupled to the circuit board, wherein the IC package includes a package substrate and an IC die coupled to the package substrate, and the IC die includes stacked strata of transistors, wherein different channel materials of different strata have different widths.

Example 43 includes the subject matter of Example 42, and further specifies that at least one of the channel materials includes a plurality of semiconductor wires.

Example 44 includes the subject matter of Example 43, and further specifies that the plurality of semiconductor wires include a III-V material.

Example 45 includes the subject matter of any of Examples 43-44, and further specifies that at least one of the channel materials includes a fin.

Example 46 includes the subject matter of Example 45, and further specifies that the fin includes silicon or germanium.

Example 47 includes the subject matter of Example 45, and further specifies that the fin has a width that is less than a width of the semiconductor wires.

Example 48 includes the subject matter of any of Examples 42-47, and further specifies that the IC die is coupled to the package substrate by solder balls.

Example 49 includes the subject matter of any of Examples 42-48, and further specifies that the circuit board is a motherboard.

Example 50 includes the subject matter of any of Examples 42-49, and further includes: wireless communication circuitry electrically coupled to the circuit board.

Example 51 includes the subject matter of any of Examples 42-50, and further includes: a display electrically coupled to the circuit board.

Example 52 includes the subject matter of any of Examples 42-51, and further specifies that the computing device is a tablet computing device, a handheld computing device, a smart phone, a wearable computing device, or a server.

Example 53 is a method of manufacturing an integrated circuit (IC) structure, including: forming a first channel material and a second channel material; forming a layer of an oxidation catalyst on the first channel material to form a first structure; and annealing the first structure to oxidize the first channel material.

Example 54 includes the subject matter of Example 53, and further specifies that forming the layer of the oxidation catalyst includes: covering the second channel material with a masking material; after covering the second channel material, forming the layer of the oxidation catalyst.

Example 55 includes the subject matter of Example 53, and further specifies that forming the layer of the oxidation catalyst includes: initially depositing the oxidation catalyst on the first channel material and on the second channel material; after initially depositing the oxidation catalyst, covering the second channel material and the adjacent oxidation catalyst with a masking material.

Example 56 includes the subject matter of any of Examples 53-55, and further includes: depositing one or more gate dielectrics to surround portions of the first channel material and the second channel material.

Example 57 includes the subject matter of Example 56, and further includes: before depositing the one or more gate dielectrics, forming source/drain materials in electrical contact with the first channel material and the second channel material.

Example 58 includes the subject matter of any of Examples 56-57, and further includes: after depositing the one or more gate dielectrics, depositing one or more gate metals.

Example 59 includes the subject matter of any of Examples 53-58, and further includes: removing the oxidation catalyst and the oxidized first channel material.

Example 60 is a method of manufacturing an integrated circuit (IC) structure, including performing any of the manufacturing operations disclosed herein.

The invention claimed is:
1. An integrated circuit (IC) structure, comprising:
 a first device stratum including a first channel material, wherein the first channel material includes a wire;
 a second device stratum including a second channel material, wherein the second channel material is above and aligned with the first channel material, and the second channel material includes a fin;
 a first gate metal at least partially surrounding the first channel material; and
 a second gate metal at least partially surrounding the second channel material;
 wherein a width of the first channel material is different from a width of the second channel material and the first gate metal has a different material composition than the second gate metal.

2. The IC structure of claim 1, wherein the width of the first channel material is less than the width of the second channel material.

3. The IC structure of claim 1, wherein the width of the first channel material is greater than the width of the second channel material.

4. The IC structure of claim 1, wherein the first device stratum is between a silicon-on-insulator structure and the second device stratum.

5. The IC structure of claim 1, wherein the width of the first channel material is between 10 nanometers and 30 nanometers.

6. The IC structure of claim 5, wherein the width of the second channel material is between 5 nanometers and 10 nanometers.

7. An integrated circuit (IC) die, comprising:
 a first device stratum including a first channel material, wherein the first channel material has a first width, and the first channel material includes a wire;
 a second device stratum including a second channel material, wherein the second channel material has a second width different from the first width, the second channel material is above the first channel material and the second channel material includes a fin;

a first gate metal at least partially surrounding the first channel material; and a second gate metal at least partially surrounding the second channel material;

wherein the first channel material has a different material composition than the second channel material, and the first gate metal has a different material composition than the second gate metal.

8. The IC die of claim 7, wherein the first width is less than the second width.

9. The IC die of claim 7, wherein the first channel material includes silicon or germanium.

10. The IC die of claim 7, wherein the second channel material includes a III-V material.

11. The IC die of claim 7, wherein the first channel material is a channel of a p-type metal oxide semiconductor (PMOS) transistor.

12. The IC die of claim 7, wherein the second channel material is a channel of an n-type metal oxide semiconductor (NMOS) transistor.

13. The IC die of claim 7, further comprising:

a plurality of conductive contacts at an outer face of the IC die, wherein at least some of the conductive contacts are in electrical contact with the first device stratum or the second device stratum.

14. A computing device, comprising:

a circuit board; and an integrated circuit (IC) package coupled to the circuit board, wherein the IC package includes a package substrate and an IC die coupled to the package substrate, and the IC die includes stacked strata of transistors, wherein different channel materials of different strata have different widths and are at least partially enclosed by different gate metals, the stacked strata of transistors comprising:

first device stratum including a first channel material, wherein the first channel material includes a wire; and a second device stratum including a second channel material, wherein the second channel material is above the first channel material, and the second channel material includes a fin.

15. The computing device of claim 14, wherein the first device stratum includes a plurality of semiconductor wires.

16. The computing device of claim 15, wherein the plurality of semiconductor wires include a III-V material.

17. The computing device of claim 14, wherein the fin includes silicon or germanium, and the fin has a width that is less than a width of the wire.

18. The computing device of claim 14, wherein the IC die is coupled to the package substrate by solder balls.

19. The computing device of claim 14, wherein the computing device is a tablet computing device, a handheld computing device, a smart phone, a wearable computing device, or a server.

* * * * *

UNITED STATES PATENT AND TRADEMARK OFFICE
CERTIFICATE OF CORRECTION

PATENT NO. : 11,676,966 B2
APPLICATION NO. : 16/354960
DATED : June 13, 2023
INVENTOR(S) : Gilbert W. Dewey et al.

It is certified that error appears in the above-identified patent and that said Letters Patent is hereby corrected as shown below:

In the Claims

In Column 26, Claim 14, Line 9, delete "first device" and insert -- a first device --, therefor.

Signed and Sealed this
First Day of August, 2023

Katherine Kelly Vidal
Director of the United States Patent and Trademark Office